(12) United States Patent
Shin et al.

(10) Patent No.: US 7,252,909 B2
(45) Date of Patent: Aug. 7, 2007

(54) METHOD TO REDUCE CD NON-UNIFORMITY IN IC MANUFACTURING

(75) Inventors: Jaw-Jung Shin, Hsin Chu (TW); Chih-Ming Ke, Hsin-Chu (TW); Burn-Jeng Lin, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 607 days.

(21) Appl. No.: 10/687,178

(22) Filed: Oct. 16, 2003

(65) Prior Publication Data

US 2004/0063038 A1   Apr. 1, 2004

Related U.S. Application Data

(63) Continuation-in-part of application No. 10/125,215, filed on Apr. 18, 2002, now Pat. No. 6,929,887.

(51) Int. Cl.
    G03F 1/00   (2006.01)
(52) U.S. Cl. .......................................... 430/5
(58) Field of Classification Search ............... 430/5, 430/394; 716/19–21
    See application file for complete search history.

(56) References Cited

U.S. PATENT DOCUMENTS

| | | | |
|---|---|---|---|
| 5,242,770 A | 9/1993 | Chen et al. | 430/5 |
| 5,821,014 A | 10/1998 | Chen et al. | 430/5 |
| 5,946,563 A | 8/1999 | Uehara et al. | 438/183 |
| 6,109,775 A | 8/2000 | Tripathi et al. | 364/488 |
| 6,197,452 B1 | 3/2001 | Matumoto | 430/5 |
| 6,218,089 B1 | 4/2001 | Pierrat | 430/394 |
| 6,281,049 B1 | 8/2001 | Lee | 438/129 |
| 6,426,269 B1 | 7/2002 | Haffner et al. | 438/401 |
| 6,807,662 B2 * | 10/2004 | Toublan et al. | 716/21 |
| 7,014,956 B2 * | 3/2006 | Chen et al. | 430/5 |

* cited by examiner

Primary Examiner—S. Rosasco
(74) Attorney, Agent, or Firm—Thomas, Kayden, Horstemeyer & Risley

(57) ABSTRACT

A method is provided for reducing Critical Dimension (CD) non-uniformity in creating a patterned layer of semiconductor material. Two masking layers are respectively created, the first masking layer comprising a main pattern, an isolated pattern and a dummy pattern, the second masking layer exposing the dummy pattern. Methods of compensating for optical proximity effects and micro-loading, as provided by the invention, are applied in creating the first masking layer. The patterned first masking layer is transposed to an underlying layer creating a first pattern therein. The second masking layer removes the dummy features from the transposed first pattern, creating a second pattern therein comprising a main pattern and an isolated pattern to which compensation for optical proximity effects and micro-loading have been applied. The second pattern serves for additional etching of underlying semiconductor material.

22 Claims, 22 Drawing Sheets

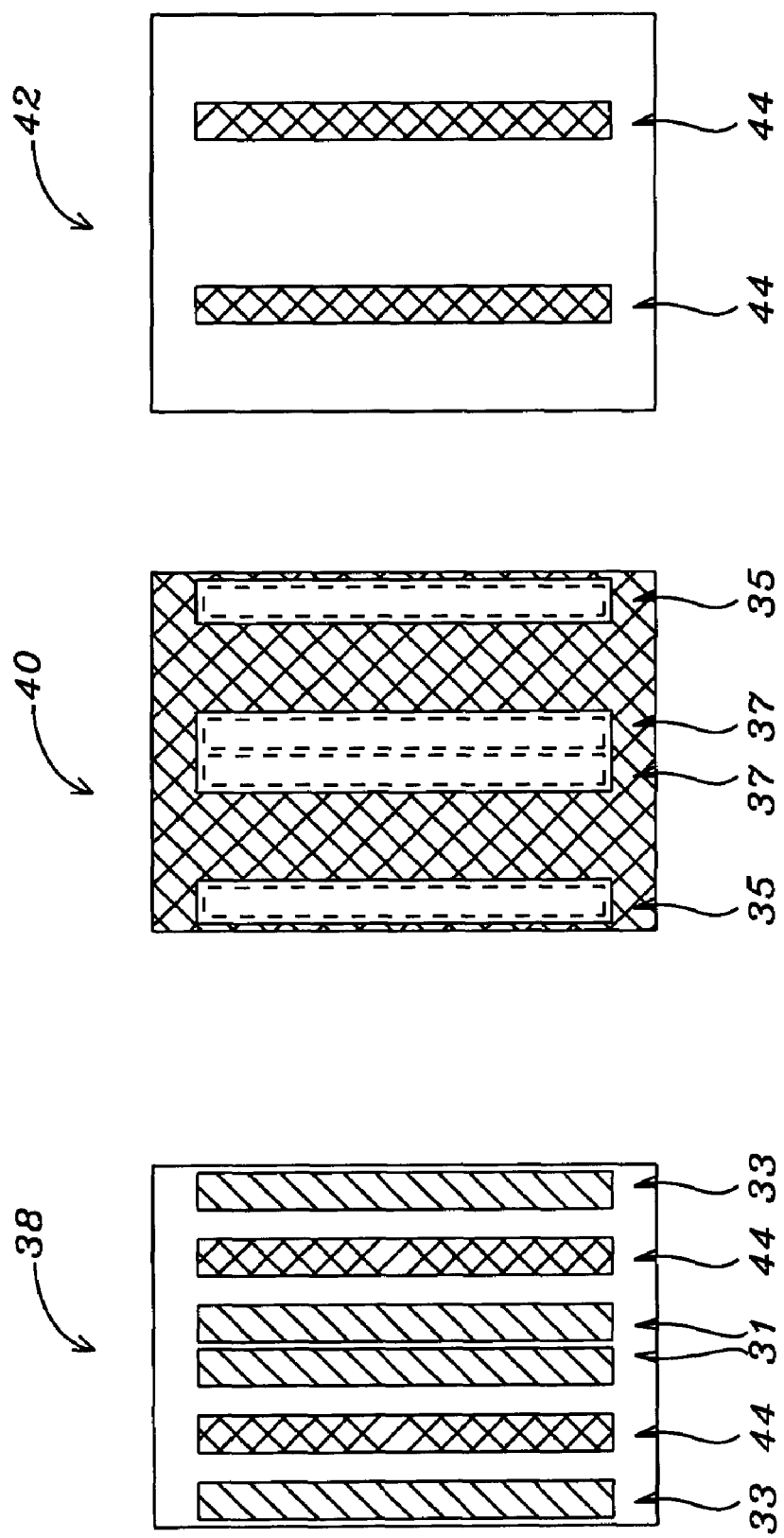

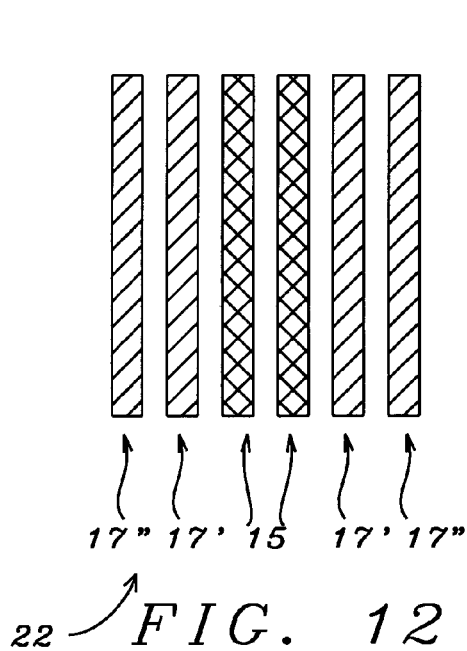
FIG. 12
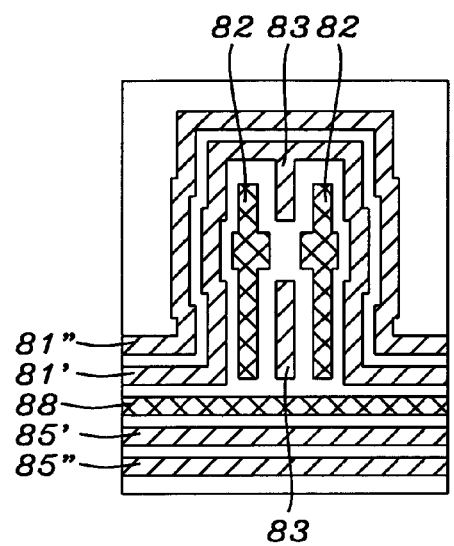
FIG. 13
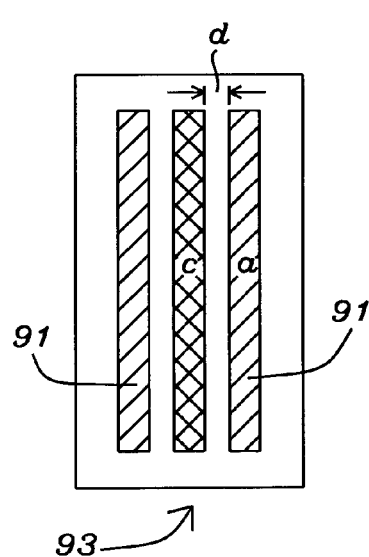
FIG. 14a
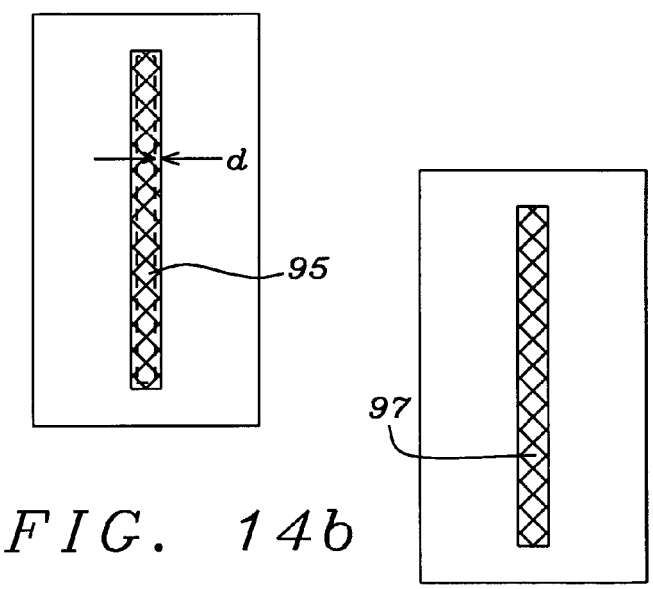
FIG. 14b
FIG. 14c

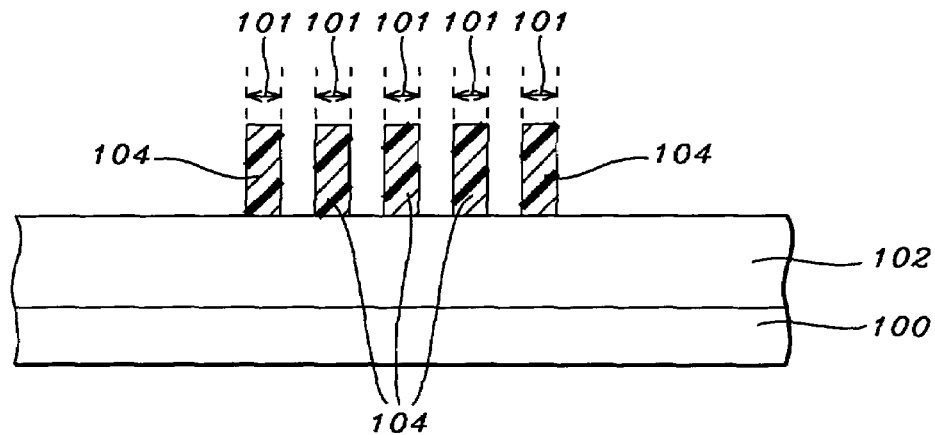
FIG. 15a — Prior Art
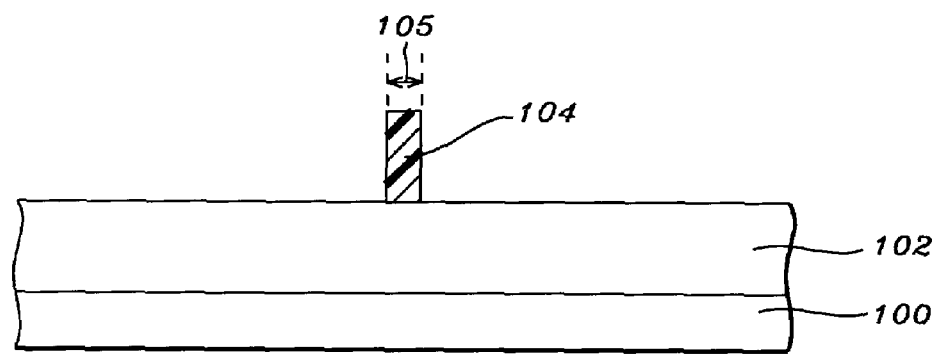
FIG. 15b — Prior Art
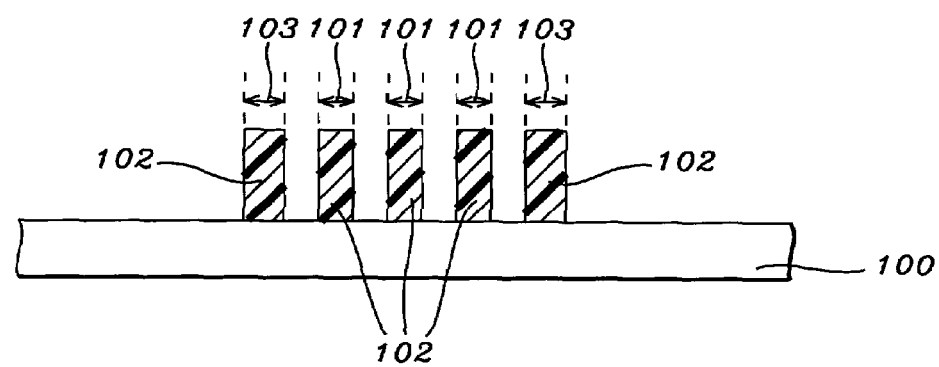
FIG. 15c — Prior Art

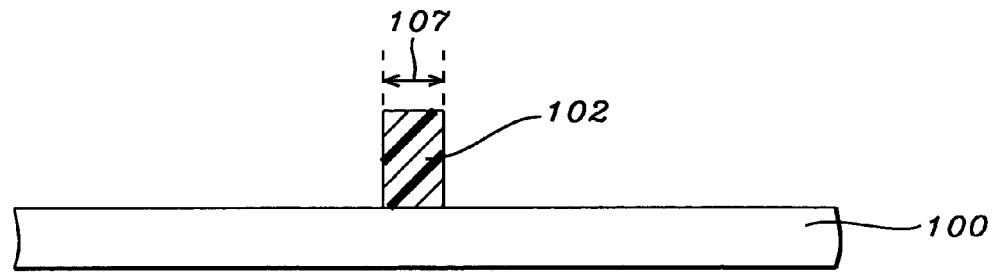
FIG. 15d – Prior Art
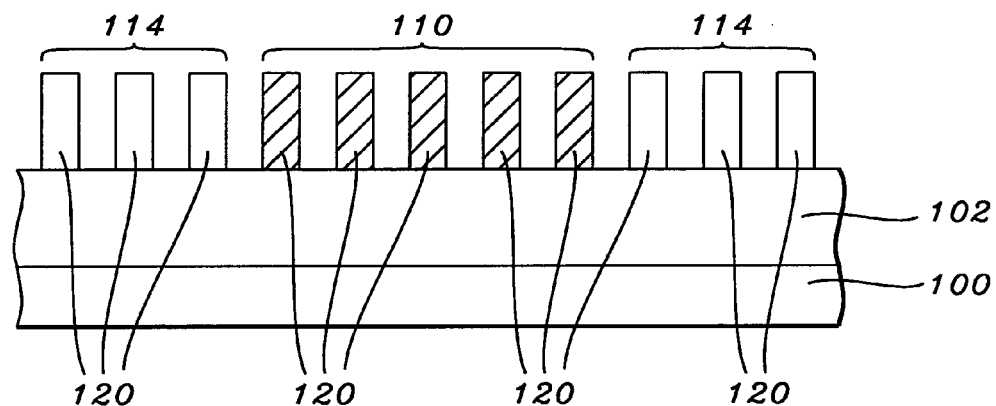
FIG. 16a
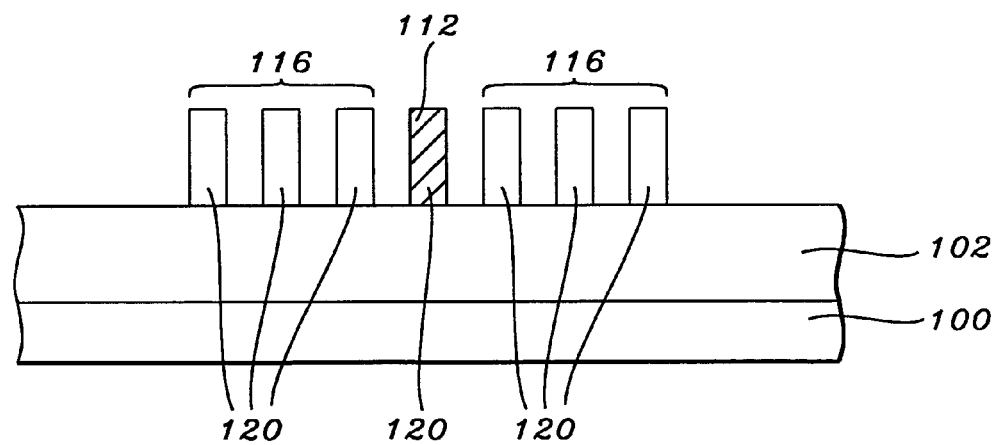
FIG. 16b

METHOD TO REDUCE CD NON-UNIFORMITY IN IC MANUFACTURING

This application is a continuation-in-part of Ser. No. 10/125,215 filing date Apr. 18, 2002 now U.S. Pat. No. 6,929,887, assigned to common assignee.

BACKGROUND OF THE INVENTION (1) Field of the Invention

The invention relates to the fabrication of integrated circuit devices, and more particularly, to a method to further improve the imaging of patterns that are used in photolithography by providing improved enhancement effects for sub-resolution lines that are added to a line pattern, to address issues of having insufficient space in order to add sub-resolution lines and issues of avoiding printing sub-resolution lines.

(2) Description of the Prior Art

The creation of semiconductor devices requires numerous interacting and mutually supporting disciplines. Addressed at this time are the disciplines that are required to create patterns on a semiconductor surface, such as the surface of a layer of photoresist or the surface of a semiconductor substrate.

Device features are transposed from a mask onto a semiconductor surface using processes of photolithographic imaging, which requires the transfer of photo energy from a source to a target surface. It is therefore to be expected that, for target features that are created in very close proximity to each other, the transfer of photo energy interacts for these very closely spaced device features, which are most commonly interconnect lines having sub-micron spacing between adjacent lines. This interaction imposes limitations on the proximity of adjacent device features, these limitations are referred to as Critical Dimensions (CD) of a design and device layout. This CD is commonly defined as the smallest spacing or the smallest line width of an interconnect line that can be achieved between adjacent interconnect lines. This CD in current technology is approaching the 0.1 to 0.2 μm range.

The invention addresses the problems of insufficient resolution and depth-of-focus in imaging interconnect lines and the spacing that is provided between these lines. In past practices, these problems have been addressed by adding sub-resolution lines in combination with off-axis illumination. The latter improves depth of focus for closely packed lines. The sub-resolution scattering bars artificially produce close packing while the scattering bars are not being printed. The latter is due to the fact that the size of the scattering bars is below the resolution limit. This method is therefore limited by the small size of the scattering bars. Increasing the size of the scattering bars in order to enhance the resolution and depth of focus results in printing these assist features. An improved method is therefore required which addresses these issues and the issue of printing of the assist features.

U.S. Pat. No. 5,1424,770 (Chen et al.) reveals a mask for reducing proximity effects using leveling bars.

U.S. Pat. No. 5,821,014 (Chen et al.) shows an OPC method using scattering bars.

U.S. Pat. No. 6,218,089 (Pierrat), U.S. Pat. No. 6,197,452 (Matumoto), and U.S. Pat. No. 6,109,775 (Tripathi et al.) are related photo processes using extra shapes to improve image resolution.

U.S. Pat. No. 5,946,563 (Uchara et al.) provides for a semiconductor device and for a method of manufacturing the same.

U.S. Pat. No. 6,281,049 B1 (Lee) provides a semiconductor device mask and for a method of creating the mask.

U.S. Pat. No. 6,426,269 Bi (Haffner et al.) provides a method for the reduction of dummy features by using optical proximity effect correction.

SUMMARY OF THE INVENTION

A principle objective of the invention is to provide a method of photolithographic exposure using Full Size Assist Features (FSAF) in order to optimize the spatial frequency and the unification of the photolithographic exposure level.

Another objective of the invention is to narrow the range of the distribution of the line-to-space ratio in a given mask pattern that is used for photolithographic exposure.

A method is provided for reducing Critical Dimension (CD) non-uniformity in creating a patterned layer of semiconductor material. A substrate is provided with one or more layers of semiconductor material, a first masking layer is deposited over the one or more layers of semiconductor material. A first pattern, comprising high-density semiconductor device features, isolated semiconductor device features and dummy features, is created in the first masking layer, thereby applying methods for compensation of optical proximity effects and micro-loading. The first pattern is transposed to at least one layer of the one or more layers of semiconductor material after which the patterned first masking layer of removed. A second masking layer is deposited over the one or more layers of semiconductor material, including the patterned at least one layer of the one or more layers of semiconductor material. A second pattern is created in the second masking layer, exposing the dummy features of the at least one layer of the one or more layers of semiconductor material. The exposed dummy features are removed from the at least one layer of the one or more layers of semiconductor material after which the patterned second masking layer is removed. The at least one layer of semiconductor material is patterned in accordance with the pattern created in the at least one layer of the one or more layers of semiconductor material.

BRIEF DESCRIPTION OF THE DRAWINGS

FIGS. 4a through 4c show a top view of the PAR implementation, applied to enhance a L/S ratio of 1:4.1.

FIG. 12 shows a top view of two packing features per side, as applied in the top view shown in FIGS. 2a through 2c.

FIG. 13 shows a top view of a two-dimensional double Full Size Assist Feature (FSAF).

FIGS. 14a through 14c show a top view of an unpacking mask, required for the desired features as shown in top view in FIGS. 1a through 1c.

FIGS. 15a through 20 address a new method to enhance Critical Diameter (CD) uniformity in the manufacturing of Integrated Circuit (IC) devices, as follows:

FIGS. 15a through 15d show prior art methods with and without Critical Diameter uniformity.

FIGS. 16a through 16f show the creation of a main pattern and an isolated pattern, using correction of optimal proximity effect and micro-loading that is provided by the invention.

FIG. 18 shows the creation of patterns that are provided by the invention in order to enhance Critical Diameter (CD) uniformity in the manufacturing of Integrated Circuit (IC) devices.

FIG. 20 shows a system flow for the creation and application of patterns that are provided by the invention in order to enhance Critical Diameter (CD) uniformity in the manufacturing of Integrated Circuit (IC) devices.

DESCRIPTION OF THE PREFERRED EMBODIMENTS

Figure 1C:
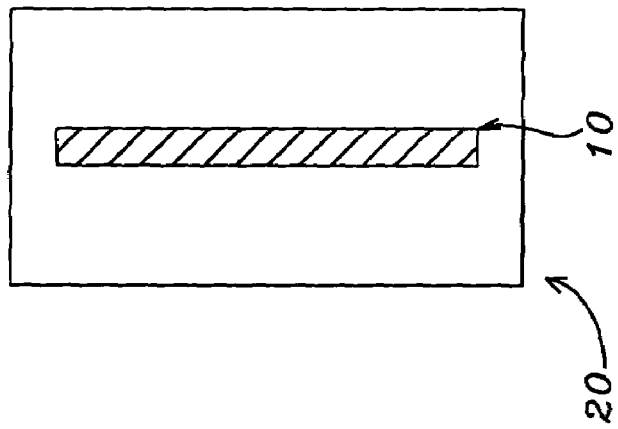
FIGS. 1a through 1c show a top view of the Printable Assist and Removal (PAR) implementation, applied to enhance an isolated line.

As has been previously highlighted, close line spacing in the range of a line-width to line-spacing (L/S) ratio of 1:1 are difficult to achieve for devices having resolution-limiting size, resulting in a narrow latitude of exposure and a small depth of focus or both. To correct this problem, a well-known method is to use off-axis illumination, in the form of annular, quadruple of dipole configurations. A limitation of this method is that the location of the ring, quadruples or dipoles can be optimized only for a special frequency in the object. For example, only the image of pairs of 1:1 spaced lines (line-width to line-spacing ratio) can be optimized. In this case of optimization, lines with a L:S=1:2 ratio will benefit less from this optimization scheme, lines that are spaced further apart benefit even less. This scheme can be applied to lines with for instance L:S=1:2 but this optimization is achieved at the expense of lines with higher and lower ratios of L:S.

A frequently applied method that is applied to improve the imaging of patterns with a larger pitch (distance between adjacent images) is to add sub-resolution lines where space is available for such addition. These sub-resolution lines are not printable but they contribute spatial frequencies, creating a condition of exposure that is close to an optimized condition. The sub-resolution lines also move the exposure level of the less optimized patterns closer to the exposure level of the optimized patterns. However, the enhancement effects of these sub-resolution lines are still significantly less effective than the full size printable lines. Finally, the sub-resolution lines may still be printed in cases where careful control is not applied to the use of these sub-resolution lines.

The invention provides for application of a Full Size Assist Feature (FSAF) pattern, the FSAF is used to maximize the contribution (by the FSAF) to spatial frequency and to achieve unification of the exposure level of the desired feature. The FSAF exposure is removed by application of an additional exposure, using a specially designed mask that contains erasing features of the surface regions where the FSAF are located.

The invention therefore provides for:

a first mask that comprises the desired features in addition to full-size assist features a second mask that comprises unpacking features that have shapes that are similar to (follow the contours of) the full-size assist features a second mask that comprises unpacking features that have shapes that are similar to the desired features the unpacking features of the second mask of the invention have dimensions that are slightly larger than the corresponding dimensions of the full-size assist features provided on the first mask the full-size assist features are placed on the first mask of the invention at a measurable distance from the desired features; this measurable distance varies between about 0.5 and 3.0 times the width of the desired minimum feature the size of the full-size assist feature on the first mask of the invention has a width that is between about 0.5 and 3 times the width of the minimum desired feature the measurable distance of the full-size assist features on the first mask of the invention is determined in accordance with a combination of desired feature size or width, the shape of the desired feature and the location of the desired feature within the exposure pattern; this determination is aimed at creating the best image possible, that is at optimizing image performance, and the size of the full-size assist features on the first mask of the invention is determined in accordance with a combination of desired feature size or width, the shape of the desired feature, and the location of the desired feature within the exposure pattern; this determination is aimed at creating the best image possible, that is at optimizing image performance.

Keeping in mind the above listed aspects of the mask of the invention, it can be stated that a key aspect of the invention is to narrow the range of the ratio of Line-Width to Line-Spacing (L:S) for a given pattern that has been created on the surface of a mask. In view of the fact that it is typically not feasible to limit the circuit designer to a range of L:S ratios, this ratio can vary between 1:1 and 1:infinity, that is between equal line-width to line-spacing to isolated lines. By adding the FSAF, the range in the ratio L:S can be significantly narrowed, making off-axis illumination extremely effective.

The conventions that are provided by the invention are next illustrated using the drawings that are part of this application.

Figure 1B:
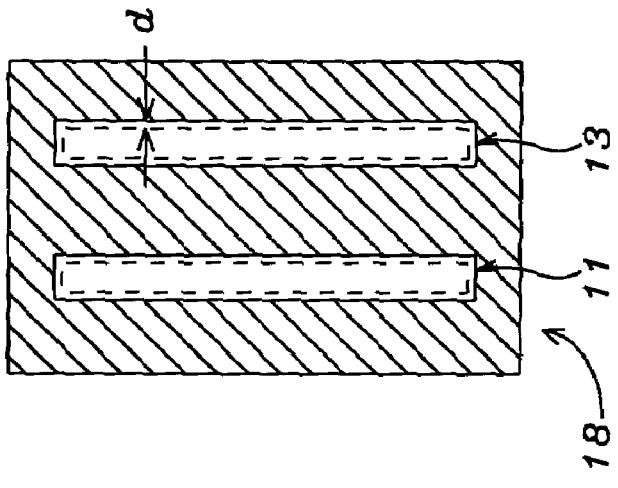
Figure 1A:
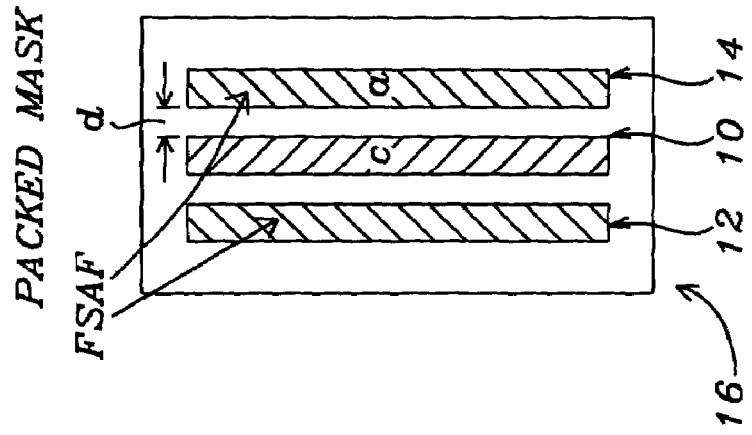

FIGS. 1a through 1c show an enhancement of an isolated line. By adding one FSAF to each side of the desired isolated line at a distance "d" from either edge of the desired isolated line, new spatial frequency components are created. The most prominent of these new spatial frequency components is the first order component of the newly formed pitch $p=c/2+a/2+d$, where "c" is the width of a given feature of the circuit design and "a" is the width of the FSAF. Preferably a=c, in which case p=c+d. The separation "d" is selected such that optimum results are obtained for a L:S ratio with a given off-axis illumination condition. These optimum results are most beneficially obtained for ratios of L:S within the range of between 1:1 and 1:2. Alternately, the value for "d" and the off-axis illumination condition are mutually adjusted until the best imaging performance is achieved, that is the best performance as measured by Depth Of Focus (DOF), exposure latitude and exposure-defocus area.

For the drawings that are shown, values of d=a and c=a have been selected as examples. The principles that are explained using these selections equally apply for different selections of these values or their ratios. FIGS. 1a through 1c show a top view of an image where two FSAF 12 and 14 have been placed, one FSAF on each side of an isolated line 10.

Shown in top view in FIGS. 1a through 1c show are:
16, FIG. 1a, the image on the surface of the packed mask; with packed mask is indicated the mask that contains an image of both the desired (or final) image and an image that will be provided in an unpacking mask;
18, FIG. 1b, the image provided on the surface of the unpacking mask;
20, FIG. 1c, the final image that is created by first exposing with the packed mask 16, after which the same surface is exposed with the unpacking mask 18; this exposure with the unpacking mask 18 is performed such that the unpacking images 11 and 13 are aligned with the images 12 and 14 of the packed mask.

The exposure sequence that has been highlighted using FIGS. 1a through 1c makes clear that the stated method of the invention is being performed. To review this method: a Full Size Assist Feature provides a FSAF pattern 18, the FSAF pattern 18 is used to maximize the contribution by the FSAF pattern 18 to spatial frequency and to achieve unification of the exposure level of the desired feature, that is exposure using the mask 16. The FSAF exposure 12 and 14 is removed by application of an additional exposure, using the specially designed unpacking mask 18 that contains erasing features 11 and 13 of the surface regions 12 and 14 where the FSAF are located.

Keeping in mind the above provided explanation of the principle of the invention, the remaining figures can be described in detail.

Figure 2C:
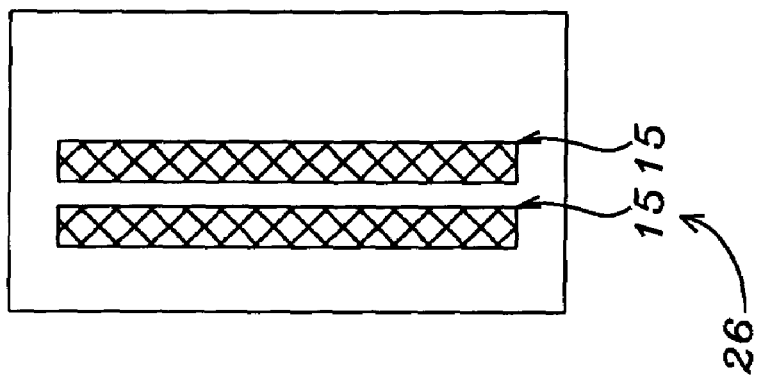
FIGS. 2a through 2c show a top view of the PAR implementation, applied to enhance a line-to-spacing (L/S) ratio of 1:1.
Figure 2B:
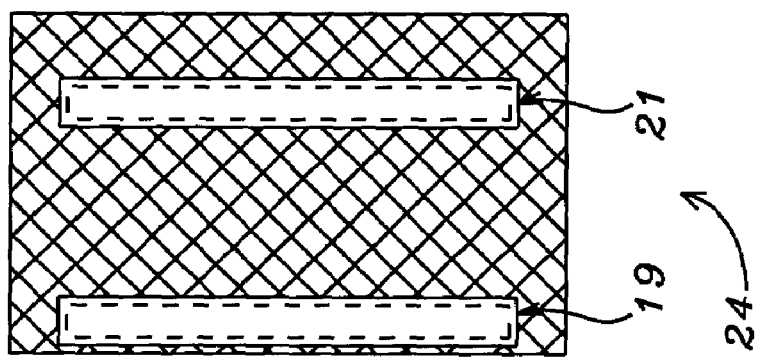
Figure 2A:
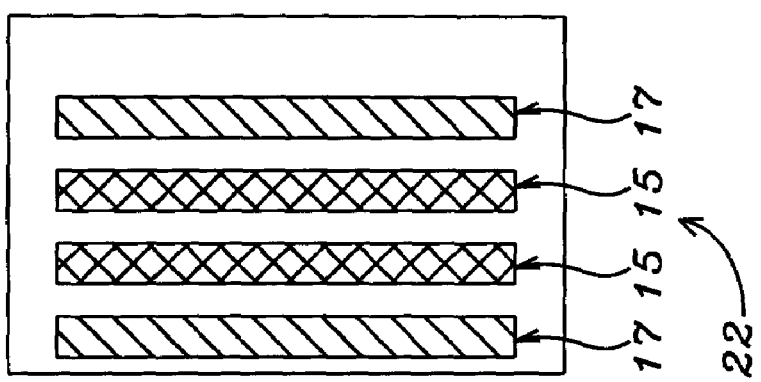

FIGS. 2a through 2c show a top view of the PAR implementation, applied to enhance a line-to-spacing (L/S) ratio of 1:1, as follows:
22, FIG. 2a, the image on the surface of the packed mask; two FSAF images 17 have been placed, one FSAF one each side of two desired or final lines 15;
24, FIG. 2b, the image on the surface of the unpacking mask; two unpacking images 19 and 21 have been provided in the surface of the unpacking mask 24;
26, FIG. 2c, the final image that is created by first exposing with the packed mask 22, after which the same surface is exposed with the unpacking mask 24; this exposure with the unpacking mask 24 is performed such that the unpacking images 19 and 21 are aligned with the images 17 of the packed mask 22. This allows pattern 19/21 to maximize the contribution to spatial frequency and to achieve unification of the exposure level of the desired feature, that is the final image 15 shown in top view in image 26.

Figure 3C:
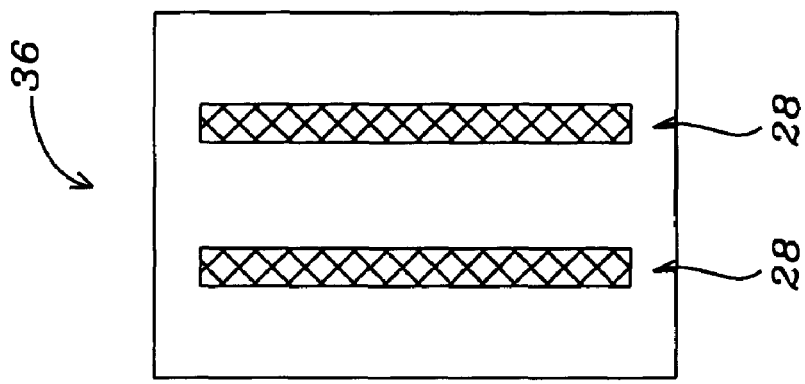
FIGS. 3a through 3c show a top view of the PAR implementation, applied to enhance a L/S ratio of 1:3.
Figure 3B:
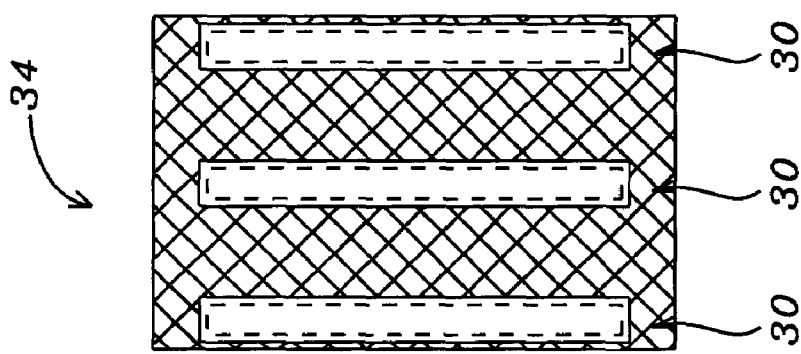
Figure 3A:
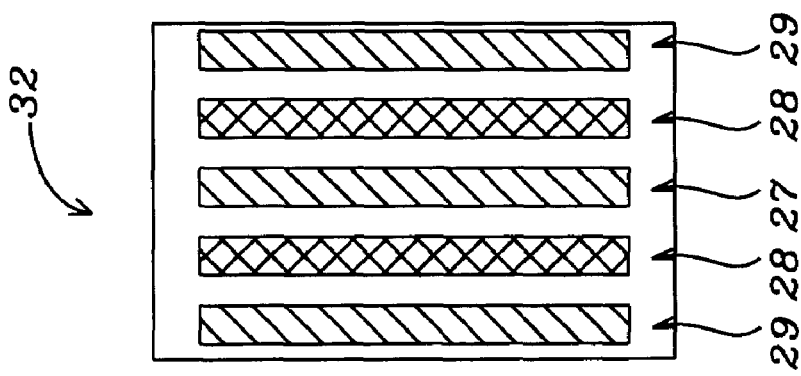

FIGS. 3a through 3c show a top view of the PAR implementation, applied to enhance a L/S ratio of 1:3. In FIGS. 3a through 3c, with a separation equal to "3c" between two desired features, one FSAF pattern is added between these two desired features, two additional FSAF patterns are added to the outside of the two desired features.

FIGS. 3a through 3c show in top view:
32, FIG. 3a, the image on the surface of the packed mask; one FSAF image 27 has been placed between two desired features 28, two additional FSAF patterns 29 have been added to the outside of the two desired features;
34, FIG. 3b, the image on the surface of the unpacking mask; three unpacking images 30 have been provided in the surface of the unpacking mask 34;
36, FIG. 3c, the final image that is created by first exposing with the packed mask 32, after which the same surface is exposed with the unpacking mask 34; this exposure with the unpacking mask 34 is performed such that the unpacking images 30 are aligned with the images 27 and 29 of the packed mask 22. This allows pattern 30, of image 34 to maximize the contribution to spatial frequency and to achieve unification of the exposure level of the desired feature, that is the final image 28 shown in top view in image 36.

FIGS. 4a through 4c show a top view of the PAR implementation, applied to enhance a L/S ratio of 1:4.1. In FIGS. 4a through 4c, with a somewhat larger separation between the lines of the desired image (L/S=1:4.1), two FSAF patterns can be added between the desired features. Since these two added FSAF patterns are in close proximity, these two patterns can be combined into one pattern. Two additional FSAF patterns are added to the outside of the two desired features.

FIGS. 4a through 4c show in top view:
38, FIG. 4a, the image on the surface of the packed mask; FSAF images 31, combined into one larger image, have been placed between two desired features 44, two additional FSAF patterns 33 have been added to the outside of the two desired features;
40, FIG. 4b, the image on the surface of the unpacking mask; unpacking images 37, combined into one image and two unpacking images 35 have been provided in the surface of the unpacking mask 40;
42, FIG. 4c, the final image 44 that is created by first exposing with the packed mask 38, after which the same surface is exposed with the unpacking mask 40; this exposure with the unpacking mask 40 is performed such that the unpacking images 35/37 are aligned with the images 33/31 respectively of the packed mask 38. This allows patterns 33/37, of image 40 to maximize the contribution to spatial frequency and to achieve unification of the exposure level of the desired feature, that is the final image 44 shown in top view in image 42.

Figure 5C:
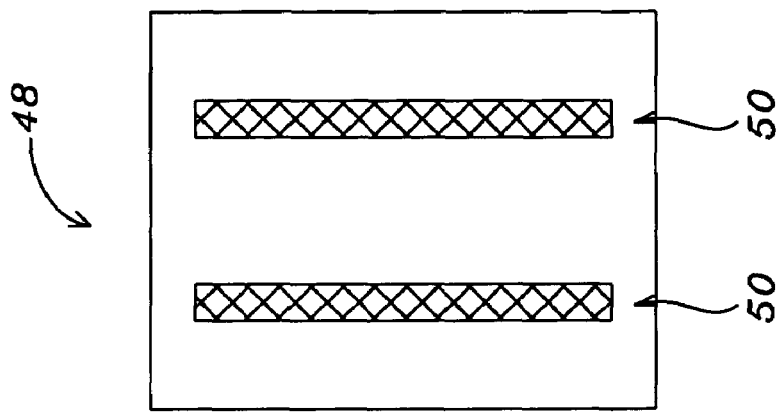
FIGS. 5a through 5c show a top view of the (wide) PAR implementation, applied to enhance a L/S ratio of 1:3.9.
Figure 5B:
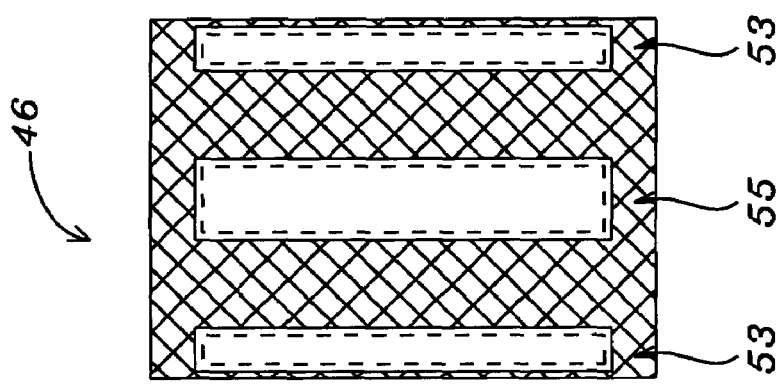
Figure 5A:
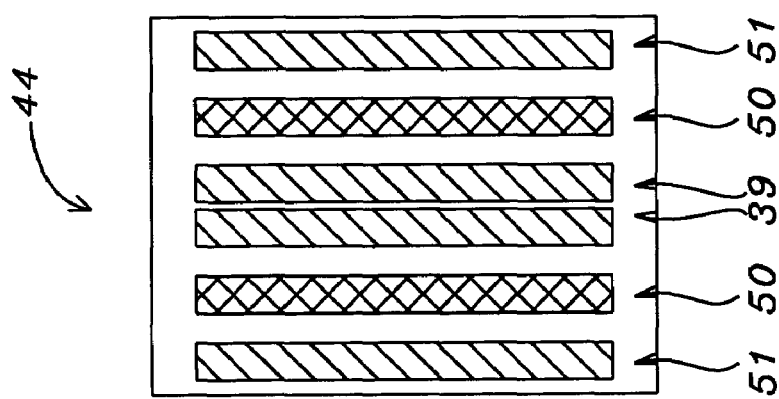

FIGS. 5a through 5c show a top view of the (wide) PAR implementation, applied to enhance a L/S ratio of 1:3.9. In FIGS. 5a through 5c, with a somewhat smaller separation between the lines of the desired image (L/S=3.9), two FSAF patterns are added between the desired features. Since these two added FSAF patterns are now in close proximity, these two patterns overlap for patterns where a distance of "d" is maintained between the edge of the FSAF pattern and the adjacent desired pattern. The pattern of two inserted two FSAF patterns can therefore combined into one pattern. Alternatively, one FSAF pattern may be applied whereby however the width of this one pattern is adjusted for optimum results of exposure as measured by DOF, exposure latitude and exposure/defocus range. This latter application is shown in top view in FIGS. 6a through 6b. Two additional FSAF patterns are added to the outside of the two desired features.

FIGS. 5a through 5c show in top view:

44, FIG. 5a, the image on the surface of the packed mask; FSAF images 39, combined into one larger image, have been placed between two desired features 50, two additional FSAF patterns 51 have been added to the outside of the two desired features;

46, FIG. 5b, the image on the surface of the unpacking mask; unpacking images 39, combined into one image 55 and two unpacking images 53, have been provided in the surface of the unpacking mask 46;

48, FIG. 5c, the final image that is created by first exposing with the packed mask 44, after which the same surface is exposed with the unpacking mask 46; this exposure with the unpacking mask 46 is performed such that the unpacking images 55/53 are aligned with the images 39/51 respectively of the packed mask 44. This allows patterns 53/55, of image 46 to maximize the contribution to spatial frequency and to achieve unification of the exposure level of the desired feature, that is the final image 50 shown in top view in image 48.

Figure 6C:
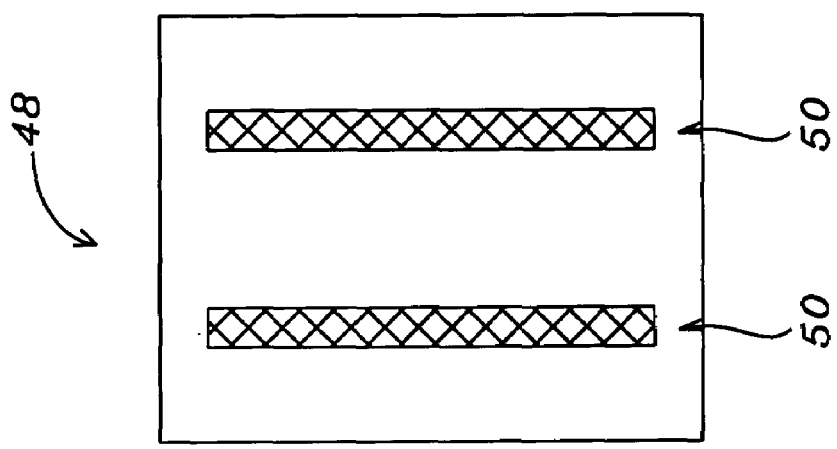
FIGS. 6a through 6c show a top view of the (narrow) PAR implementation, applied to enhance a L/S ratio of 1:3.9.
Figure 6B:
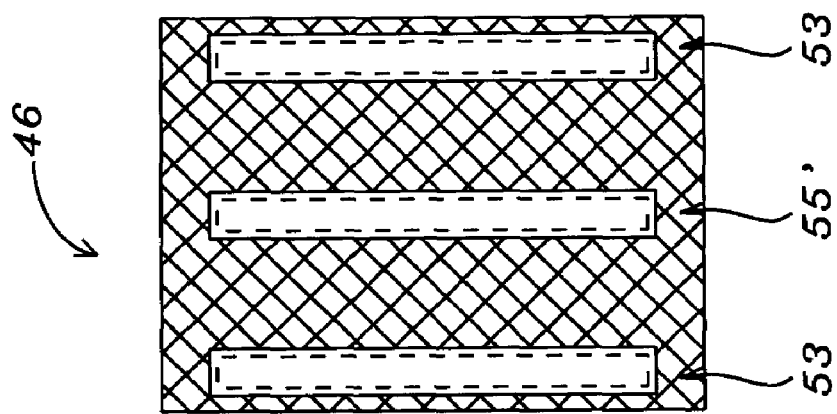
Figure 6A:
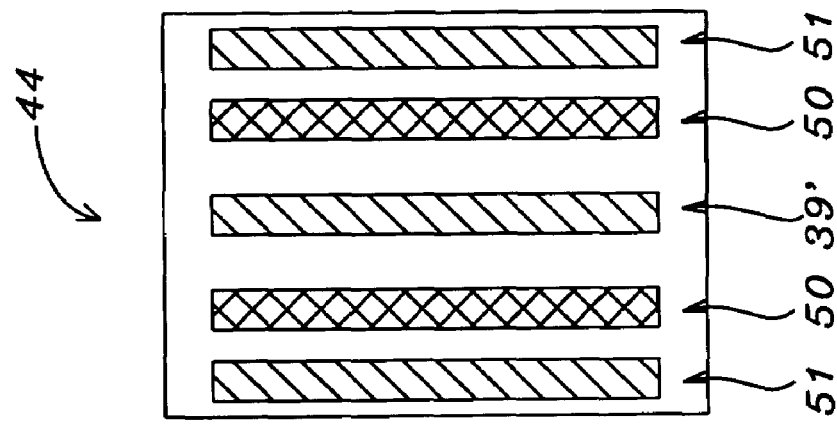

FIGS. 6a through 6c show a top view of the (narrow) PAR implementation, applied to enhance a L/S ratio of 1:3.9. In FIGS. 6a through 6c, the FSAF images 39 of FIG. 5a have been replaced with the one FSAF image 39', the unpacking image 55 of FIG. 5b has been replaced with the one unpacking image 55', as previously highlighted.

Figure 7C:
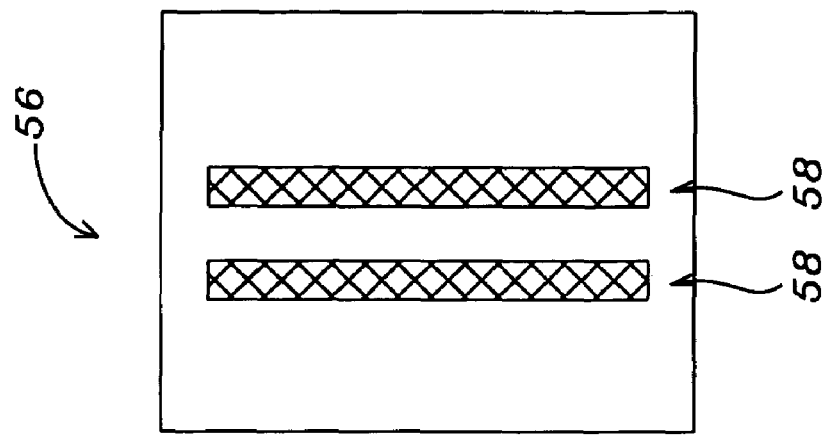
FIGS. 7a through 7c show a top view of the PAR implementation, applied to enhance a L/S ratio of 1:1.5.
Figure 7B:
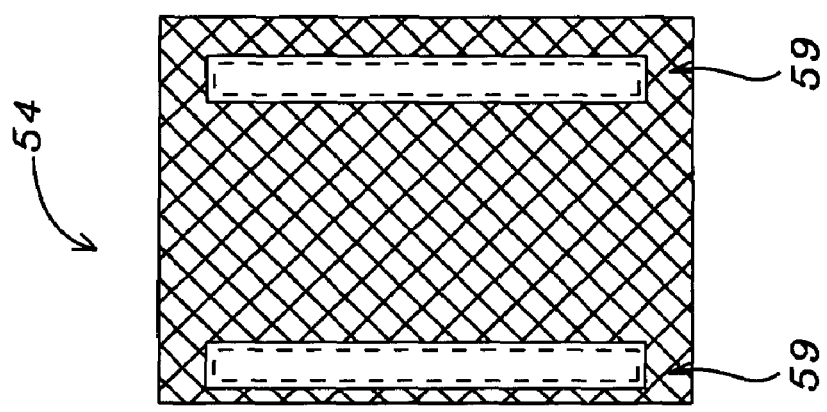
Figure 7A:
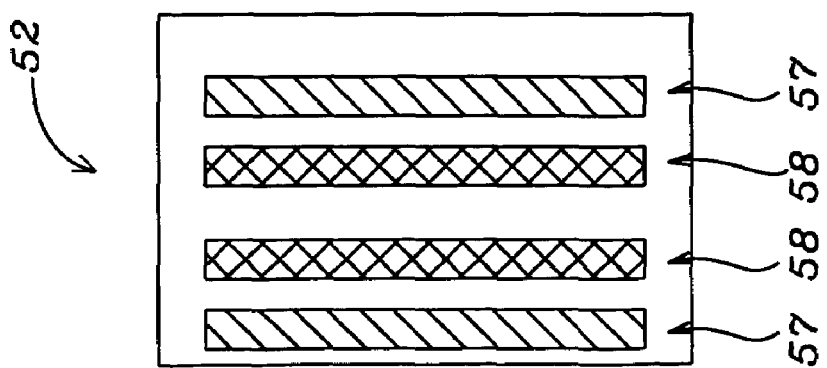

FIGS. 7a through 7c show a top view of the PAR implementation, applied to enhance a L/S ratio of 1:1.5. In FIGS. 7a through 7c the distance between the desired features is between "1c" and "2c", L:S=1:1.5 For these cases, there is no room available between the features for the addition of a FSAF image which however still allows for the addition of FSAF images to the outside of the desired image.

FIGS. 7a through 7c show in top view:

52, FIG. 7a, the image on the surface of the packed mask; FSAF images 57 have been added to the outside of the two desired features 58

54, FIG. 7b, the image on the surface of the unpacking mask; unpacking images 59 have been provided in the surface of the unpacking mask 54;

56, FIG. 7c, the final image that is created by first exposing with the packed mask 52, after which the same surface is exposed with the unpacking mask 54; this exposure with the unpacking mask 54 is performed such that the unpacking images 59 are aligned with the images 57 of the packed mask 52. This allows patterns 59, of image 54 to maximize the contribution to spatial frequency and to achieve unification of the exposure level of the desired feature, that is the final image 58 shown in top view in image 56.

Figure 8C:
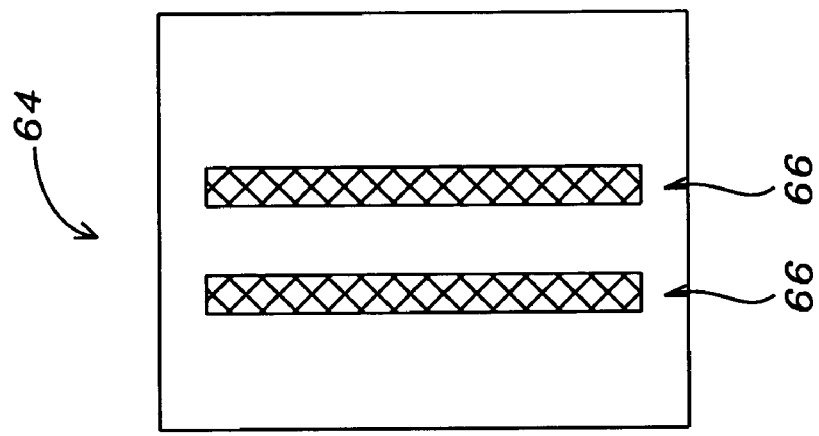
FIGS. 8a through 8c show a top view of the PAR implementation, applied to enhance a L/S ratio of 1:2.
Figure 8B:
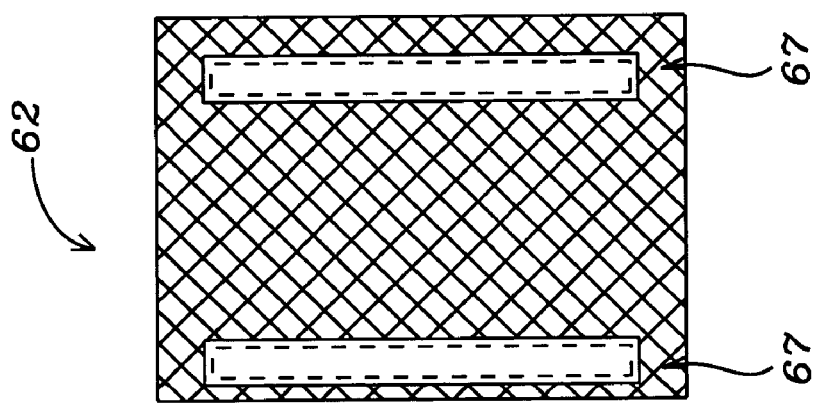
Figure 8A:
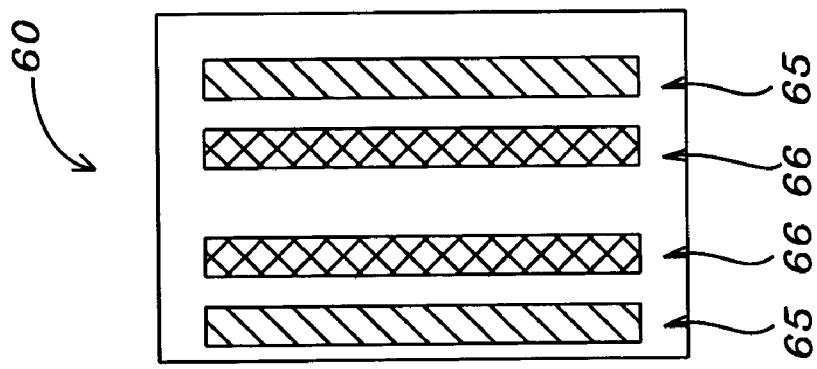

FIGS. 8a through 8c show a top view of the PAR implementation, applied to enhance a L/S ratio of 1:2. in FIGS. 8a through 8c the distance between the desired features is "2c", L:S=1:2. For this case, there is no room available between the features for the addition of a FSAF image which however still allows for the addition of FSAF images to the outside of the desired image.

FIGS. 8a through 8c show in top view:

60, FIG. 8a, the image on the surface of the packed mask; FSAF images 65 have been added to the outside of the two desired features 66

62, FIG. 8b, the image on the surface of the unpacking mask; unpacking images 67 have been provided in the surface of the unpacking mask 62;

64, FIG. 8c, the final image that is created by first exposing with the packed mask 60, after which the same surface is exposed with the unpacking mask 62; this exposure with the unpacking mask 62 is performed such that the unpacking images 67 are aligned with the images 65 of the packed mask 60. This allows patterns 67, of image 62 to maximize the contribution to spatial frequency and to achieve unification of the exposure level of the desired feature, that is the final image 66 shown in top view in image 64.

Figure 9C:
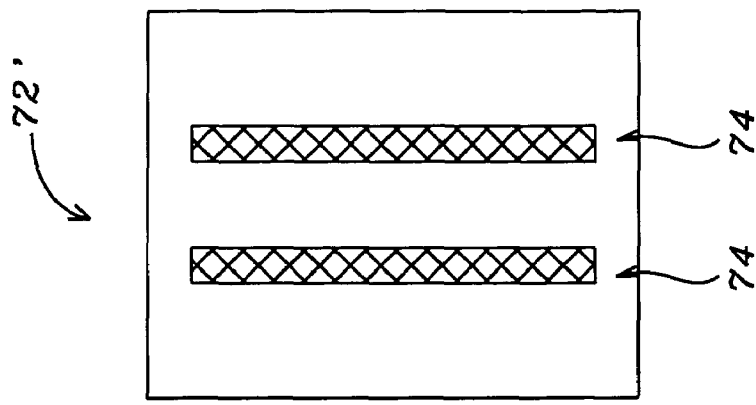
FIGS. 9a through 9c show a top view of the PAR implementation, applied to enhance a L/S ratio of 1:2.5.
Figure 9B:
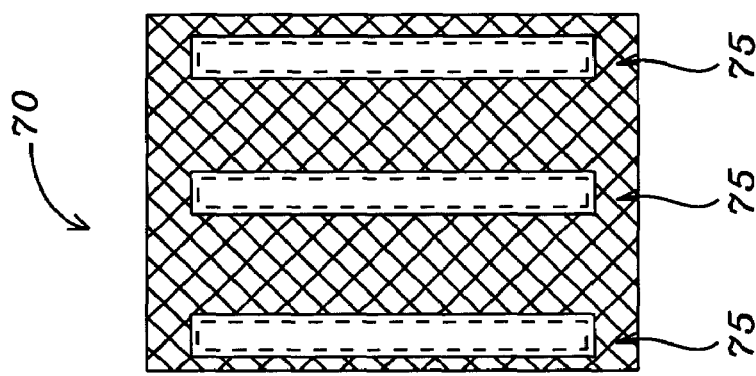
Figure 9A:
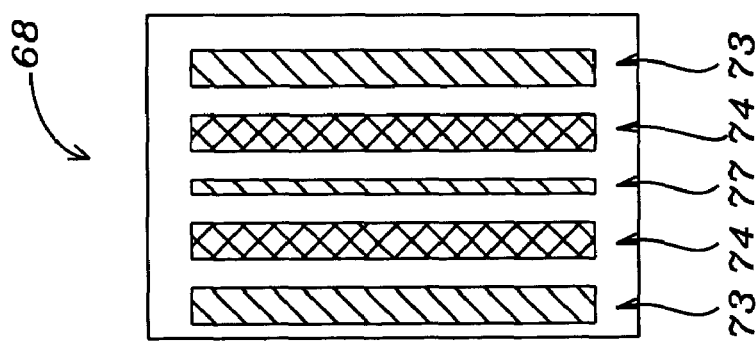

FIGS. 9a through 9c show a top view of the PAR implementation, applied to enhance a L/S ratio of 1:2.5. In FIGS. 9a through 9c the distance between the desired features is between "2c" and "2c", L:S=1:2.5. For this case, there is room available between the features for the addition of a FSAF image but the FSAF image in this case the value for "a" must be smaller than dimension "c" in order to maintain the value of parameter "d". Two FSAF images have been added to the outside of the desired image.

FIGS. 9a through 9c show in top view:

68, FIG. 9a, the image on the surface of the packed mask; one FSAF images 77 has been placed between two desired features 74, two additional FSAF patterns 73 have been added to the outside of the two desired features 74

70, FIG. 9b, the image on the surface of the unpacking mask; three unpacking images 75 have been provided in the surface of the unpacking mask 70;

72, FIG. 9c, the final image that is created by first exposing with the packed mask 68, after which the same surface is exposed with the unpacking mask 70; this exposure with the unpacking mask 70 is performed such that the unpacking images 75 are aligned with the images 73/77 of the packed mask 68. This allows pattern 75, of image 70 to maximize the contribution to spatial frequency and to achieve unification of the exposure level of the desired feature, that is the final image 74 shown in top view in image 72.

It is clear from the above that, for linear exposures, the descriptions that have been provided address conditions that are required for the implementation of the invention. Additional detail will be provided relating to non-linear or 2-D exposures in the following drawings.

Figure 10C:
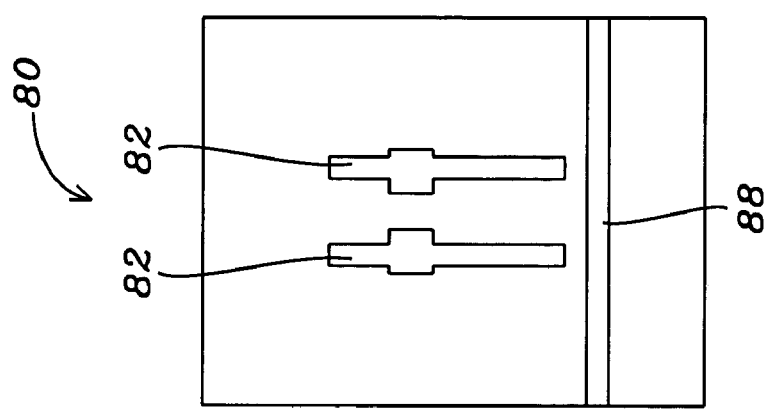
FIGS. 10a through 10c show a top view of the PAR implementation, applied to first two-dimensional features.
Figure 10B:
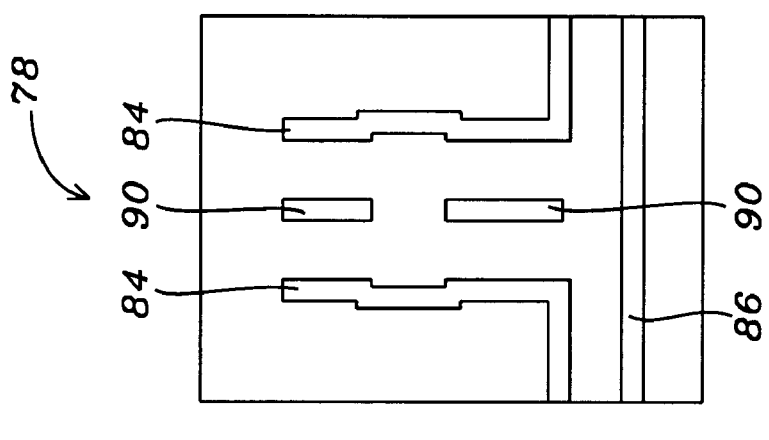
Figure 10A:
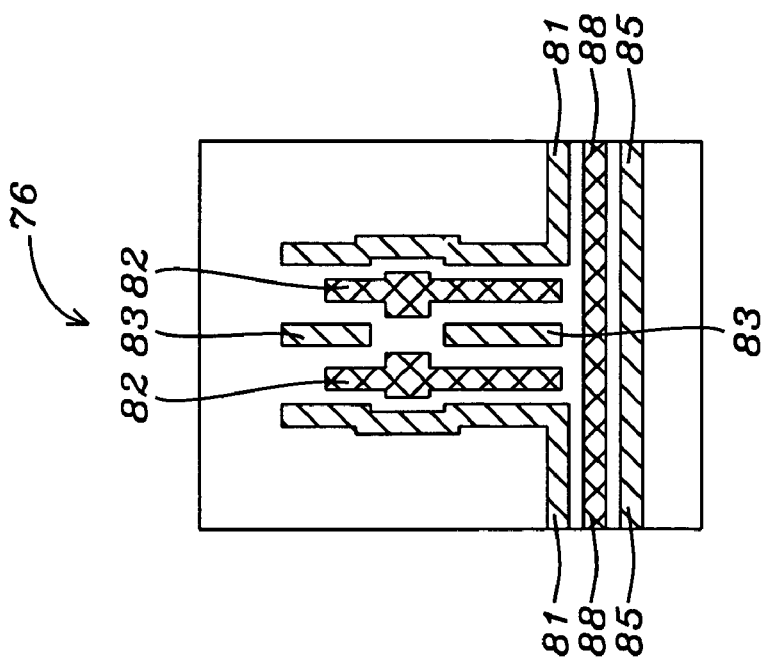

FIGS. 10a through 10c show a top view of the PAR implementation, applied to first two-dimensional features. FIGS. 10a through 10c show the top view of a typical layout for a polysilicon gate electrode. FSAF images are inserted inside and outside the two gate lines in accordance with the above stated principles.

FIGS. 10a through 10c show in top view:

76, FIG. 10a, the image on the surface of the packed mask; FSAF images 83 has been placed between two desired features 82, two additional FSAF patterns 81 have been added to the outside of two desired features 82, additional FSAF patterns 85 has been added to the outside of the desired feature 88

78, FIG. 10b, the image on the surface of the unpacking mask; unpacking images 84, 86 and 90 have been provided in the surface of the unpacking mask 78; unpacking images 84, 86 and 90 of unpacking mask 78 align with FSAF patterns 81, 85 and 83 respectively provided on the packed mask 76

80, FIG. 10c, the final image that is created by first exposing with the packed mask 76, after which the same surface is exposed with the unpacking mask 78; this exposure with the unpacking mask 78 is performed such that the unpacking images 84, 86 and 90 are aligned with the images 81, 85 and 83 respectively of the packed mask 76. This allows patterns 81, 85 and 83 of image 78 to maximize the contribution to spatial frequency and to achieve unification of the exposure level of the desired feature, that is the final image 82 and 88 shown in top view in image 80.

Figure 11C:
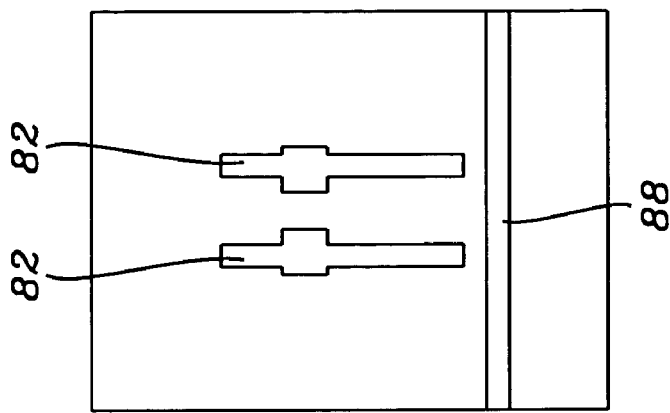
FIGS. 11a through 11c show a top view of the PAR implementation, applied to second two-dimensional features.
Figure 11B:
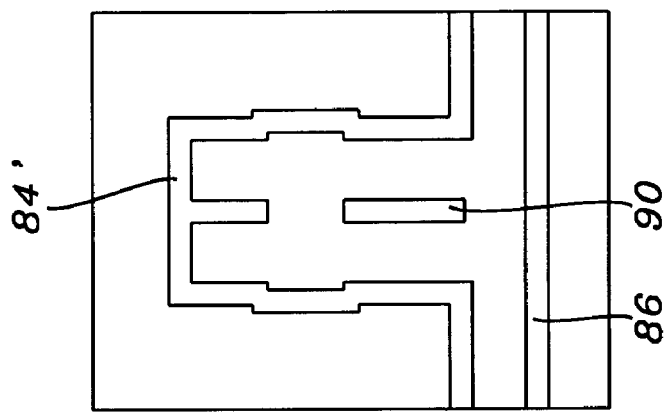
Figure 11A:
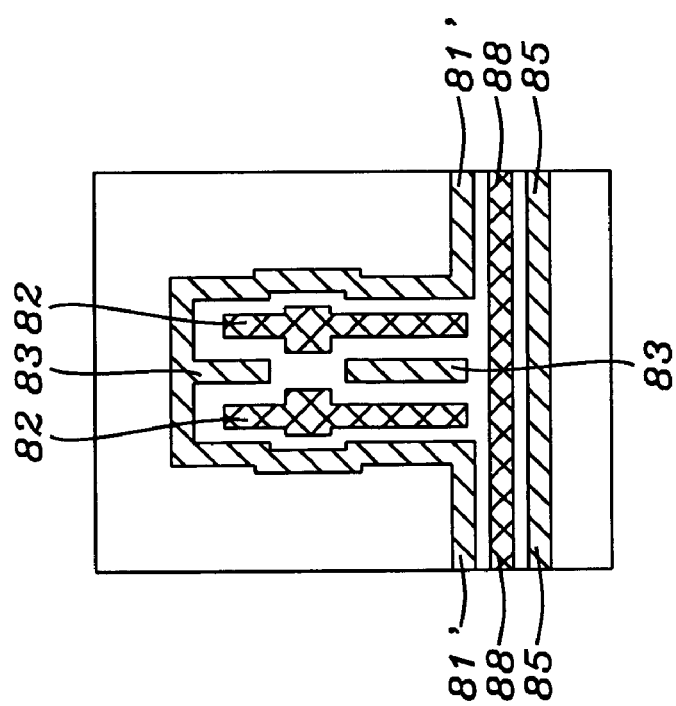

FIGS. 11a through 11c show a top view of the PAR implementation, applied to second two-dimensional features. FIGS. 11a through 11c show the same images as those that have been shown in the preceding FIGS. 10a through 10c, with the exception of patterns 81' and 84', which in FIGS. 11a through 11c take the place of patterns 81 and 84 respectively of FIGS. 10a through 10c. An additional horizontal bar has been added to the FSAF pattern 81'/84' of exposures 76 and 78 respectively. The use of this additional horizontal bar can experimentally be determined by evaluating optimum imaging performance for the ends of polysilicon lines 82 that are closest to this additional horizontal bar.

It must be pointed out that the invention does not impose a limit on the number of FSAF images that are provided, just as long as there is sufficient surface area available to create these FSAF images thereover.

FIG. 12 shows a top view of two packing features per side, as applied in the top view shown in FIGS. 2a through 2c. FIG. 12 shows a top view that is an extension of the top view that has been shown in FIGS. 2a through 2c, the FSAF packing images 17 of FIGS. 2a through 2c have been expanded to two packing images 17' and 17".

FIG. 13 shows a top view that is an extension of the top view that has been shown in FIG. 12, the FSAF packing image 85 of FIG. 12 has been expanded to two packing images 85' and 85", the FSAF packing image 81' of FIG. 12 has been expanded to two packing images 81' and 81".

FIGS. 14a through 14c show a top view of an unpacking mask, required for the desired features as shown in top view in FIGS. 1a through 1c. Specifically highlighted in FIG. 14b is a different way to create a layout of the unpacking mask, as follows:

91 are the Full Size Assist Features (FSAF)
93 is the desired feature
95 is the layout of the unpacking feature
97 shows the final feature.

The mask is a light-field mask, the features 95 of the unpacking mask are similar to and slightly larger than the desired features 97.

The following comments apply to the creation of the packed and the unpacking mask of the invention. After creating the packed mask, an unpacking mask is created by repeating the FSAF image and by making each of these images slightly larger (on the unpacking mask) in order to compensate for overlay errors that may occur during the second exposure, that is the exposure of the unpacking mask. For exposures of positive photoresist, the packed mask may be a light-field mask comprising opaque surface regions for the desired features and for the FSAF images. The corresponding unpacking mask is then a dark field mask, comprising transparent surface regions for the FSAF images. Using these masks and performing first an exposure with the packed mask and second an exposure of the same surface of photoresist with the unpacking mask, photoresist features that correspond to the desired features will be created. It must thereby be pointed out that the sequence of exposure is not important and can be reversed from the sequence indicated. By using negative photoresist, the indicated combination of mask polarities creates trench type features in layer of photoresist. This latter type of photoresist image is applicable in cases where the circuit features are delineated by an additive process such as plating or lift-off as opposed to a subtractive process such as etching.

The creation of device features, thereby basing this creation of device features on the above principles of using packed and unpacking images over a first and a second mask as described in detail using FIGS. 1a through 14c, can further be extended by special processing procedures, these processing procedures will now be explained in detail. The above principles of using packed and unpacking images over a first and a second mask, as described in detail using FIGS. 1a through 14c, will collectively be referred to as Compensating for Optical Proximity Effects (COPE).

For the following processing procedures, it is assumed that the above Compensating for Optical Proximity Effects (COPE) is implemented. Specifically, device features are assumed to be created by:

implementing the above highlighted method of photolithographic exposure using Full Size Assist Features (FSAF) in order to optimize the spatial frequency and the unification of the photolithographic exposure level, and narrowing the range of the distribution of the line-to-space ratio in a given mask pattern that is used for photolithographic exposure.

Keeping in mind the above stated assumptions relating to the creation of device features, an extension of this process is now described.

This extension is based using the following processing steps and definitions:

1. a pattern of device features can comprise densely patterned features, referred to as the main pattern, and less-densely patterned features, referred to as isolated pattern; a pattern of densely patterned device features is defined as a pattern in which a shortest distance between adjacent features of the pattern is less than or equal to 0.2 μm, a pattern of isolated patterned device features is defined as a pattern in which a shortest distance between adjacent features of the pattern exceeds 0.2 μm 2. the invention addresses the simultaneous creation of both a main pattern and isolated pattern, such as the simultaneous creation of a pattern of densely spaced and isolated interconnect line 3. dummy features are added close to both the main pattern and close to critical isolated patterns, converting the pattern of the isolated pattern into a dense pattern 4. optical proximity correction, as this optical proximity correction has been described above using FIGS. 1a through 14c, is applied (as the above highlighted COPE) to both the main pattern, the isolated pattern and the added dummy features, assuring the same CD for the COPE main pattern, the COPE isolated pattern and the COPE dummy features, creating a First Exposure Pattern (FEP)

5. a first photo sensitive layer, such as a first layer of photoresist, is exposed to FEP 6. the exposed first layer of photoresist is developed, the FEP pattern created in the first layer of photoresist remains in place 7. an underlying layer of semiconductor material, such as a layer of metal in which interconnect traces are to be created, is etched in accordance with FEP the pattern created in the developed first layer of photoresist, transposing both the COPE main pattern, the COPE dummy features and the (COPE) isolated pattern to the underlying layer; as underlying layer can be used a layer of semiconductor material that is selected from the group comprising but not limited to a layer of dielectric, a layer of insulating material, a layer of passivation material, a layer of hardmask material and a layer of conductive material 8. the developed first layer of photoresist is removed
9. a second photo sensitive layer, such as a second layer of photoresist, is coated over the etched underlying layer
10. the second layer of photoresist is exposed and developed, creating therein a Second Exposure Pattern (SEP) that comprises and exposes the dummy features, and
11. the dummy features are removed from the underlying layer in accordance with the SEP, leaving the COPE main pattern and the COPE isolate pattern in place underlying layer of semiconductor material.

FIGS. 15a-15d illustrate etching bias variations between dense line patterns and isolated line patterns due to microloading in the etch process.

Both dense line patterns and isolated line patterns, even after compensation for optical proximity effects with the objective of having the same CD after photoresist development, still have CD variations in the etch process.

FIGS. 15a and 15b show the same CD of dense line and isolated line pattern after exposure and development, whereby optical proximity correction has been applied.

However, the dense line CD and the isolated line CD shown in FIGS. 15(c) and 15(d) will be different after the etch process due to environmental variations, which is the so-called micro loading effect.

In addition, the edge line and the middle line in a dense line pattern will have different CD after etching due to the micro-loading effect. With the dummy pattern inserted through the etch process, the micro-loading effect will cause the CD variation of the dummy pattern that is illustrated in FIGS. 16(a)-16(f).

A first layer 104 of photoresist is patterned, using conventional method of photolithographic exposure and development.

FIGS. 15a through 15c show a cross section of semiconductor surface 100 under the following conditions of processing:

FIG. 15a shows a cross section of a patterned and developed layer 104 of photoresist for a main pattern in which no CD effect is present, that is cross section 101 for each of the elements of the developed layer 104 is the same FIG. 15b shows a cross section of a patterned and developed layer 104 of photoresist for an isolated feature pattern in which no CD effect is present FIG. 15c shows the impact of proximity effects on the elements of a main pattern that is created in the film 102, for applications where the wafer is provided with full size dummy features but where no corrections have been provided for the exposure proximity effect; cross section 103 is larger than the cross sections 101, which may be assumed to be identical to the cross sections 101 shown in FIG. 15a, and FIG. 15d shows the impact of proximity effects on the isolated feature of FIG. 15b that is created in the film 102, for applications where the wafer is provided with full size dummy features but where no corrections have been provided for the exposure proximity effect; cross section 107 is larger than the cross sections 105 shown in FIG. 15b.

FIGS. 15a through 15d are shown to indicate that, for a wafer that is provided with a conventional pattern of dummy features but whereby no corrections are provided for the exposure proximity effect, that is FIGS. 15c and 15d, the negative impact of the proximity effect is experienced. A pattern of dummy features is typically provided for improvements of exposure and photoresist etch.

The reduction of the CD bias in creating a main pattern and an isolated pattern is now highlighted using FIGS. 16a through 16f. The process advances from FIGS. 16a/16b to FIGS. 16c/16d to FIGS. 16e/16f.

Referring first specifically to the cross section of FIGS. 16a and 16b, there are shown cross sections of a semiconductor surface 100, a layer or film 102 of semiconductor material is deposited over surface 100. A main pattern and an isolated pattern are to be created in layer 102.

Patterned layer 120 is a layer of photosensitive material, such as a layer of photo resist, that has been patterned and developed, creating in layer 120:

a main pattern 110
a dummy pattern 114 close to and adjacent to the main pattern 110
an isolated pattern 112, and
a dummy pattern 116 close to and adjacent to the isolated pattern 112.

By applying optical proximity correction, which has been explained above using FIGS. 1a through 14c, improved CD control is assured for the main pattern 110, the isolated pattern 112 and the dummy patterns 114 and 116.

Figure 16C:
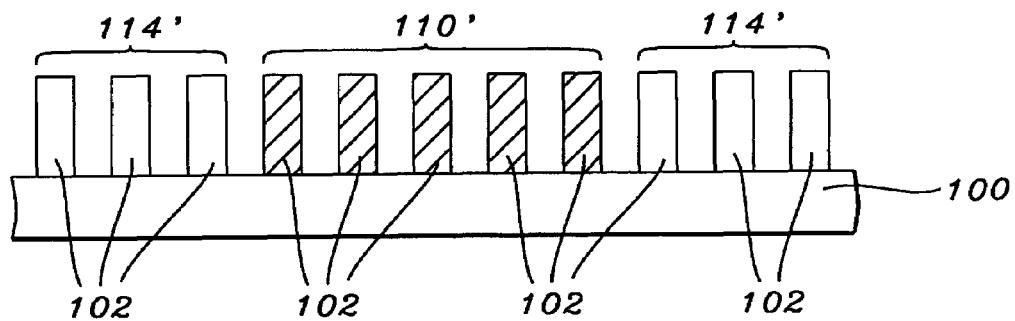
Figure 16D:
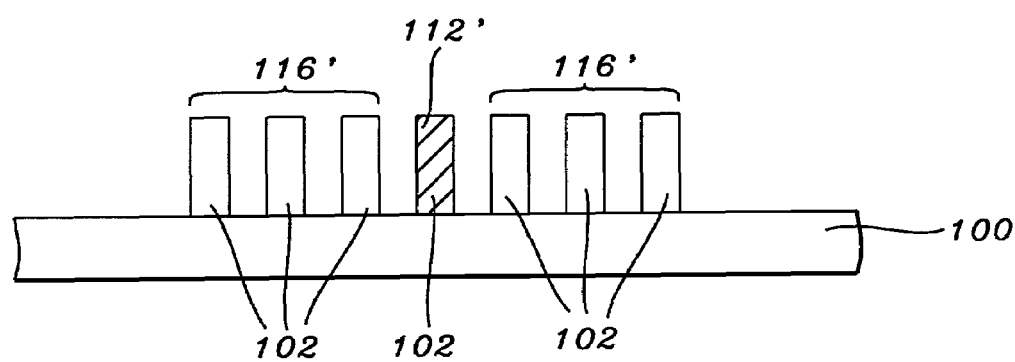

The pattern created in the developed layer 120 of photo sensitive material is now transposed (by etching) into the underlying layer 102, after which the developed layer 120, of photo sensitive material, is removed. This results in the cross section as shown in FIGS. 16c and 16d, wherein are shown the transposed main pattern 110', the transposed dummy pattern 114', the transposed isolated pattern 112' and the transposed dummy pattern 116'.

Figure 16E:
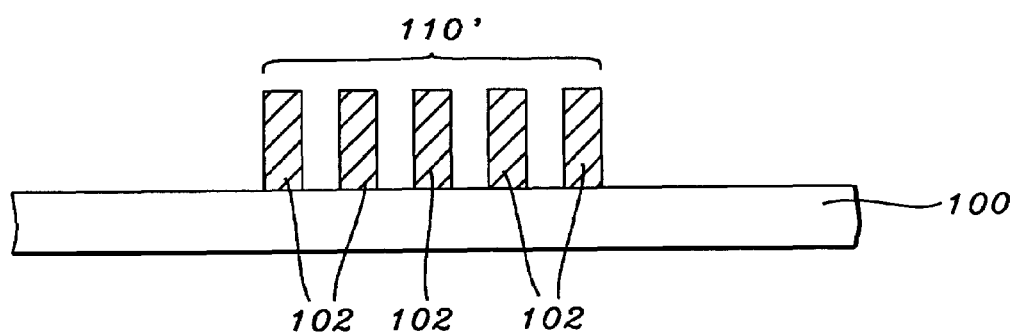
Figure 16F:
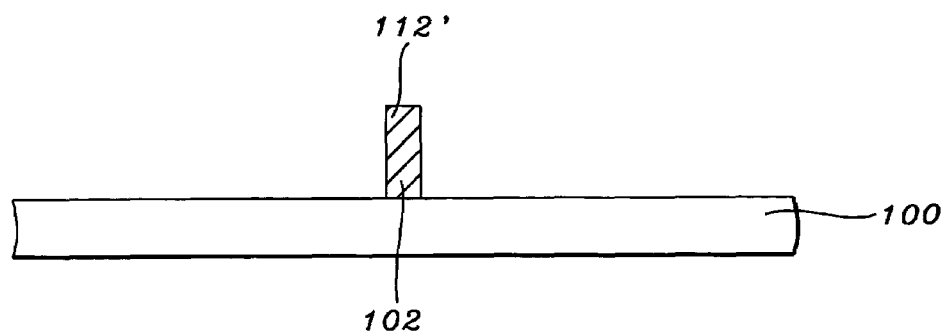

By now removing the dummy patterns 114' and 116' from the semiconductor surface 100, the cross sections that are shown in FIGS. 16e and 16f are obtained. Highlighted in FIGS. 16e and 16f are the remaining main pattern 110' and the isolated pattern 112', both patterns having been obtained by applying proximity correction and both patterns therefore having improved CD uniformity.

The process flow of the invention is shown next using FIGS. 17a through 17f for this purpose. Where the cross sections of FIGS. 16a through 16f highlight the creation of a main pattern, an isolated pattern and dummy features, FIGS. 17a through 17f in addition show the function of the second layer of photoresist that is used to remove the dummy features. The main pattern and isolated pattern of FIGS. 16a through 16f have been replaced in the cross sections of FIGS. 17a through 17f with a simplified pattern 122 of two elements, since such a simplified pattern adequately describes the function of the second layer of photoresist for the removal of the dummy features.

Shown in the flow of FIGS. 17a through 17f is the application of a developed first and second layer of photo sensitive layer and how these layers are used for the creation of a main pattern 122 and for the removal of the dummy features 124. The process flow proceeds sequentially from FIGS. 17a through 17f.

Figure 17A:
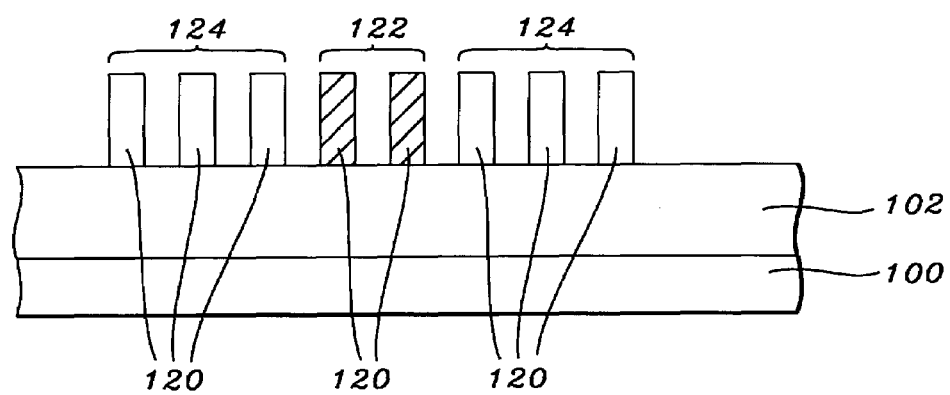
FIGS. 17a through 17f show the creation of two device elements, using correction of optimal proximity effect and micro-loading, applying two layers of photo sensitive material.

Shown in the cross section of FIG. 17a is a pattern 122 that is to be created, applying optical proximity correction, in a film or layer 102 of semiconductor material. Adjacent and closely spaced to pattern 122 is a pattern 124 of dummy features, both the pattern 122 and pattern 124 that are shown in cross section in FIG. 17a are created using a photo sensitive material, such as photoresist, over layer 102.

In the creation of the patterned layer 120 of photo sensitive material, corrections for optical proximity effects and micro-loading, as provided by the invention, are applied.

Figure 17B:
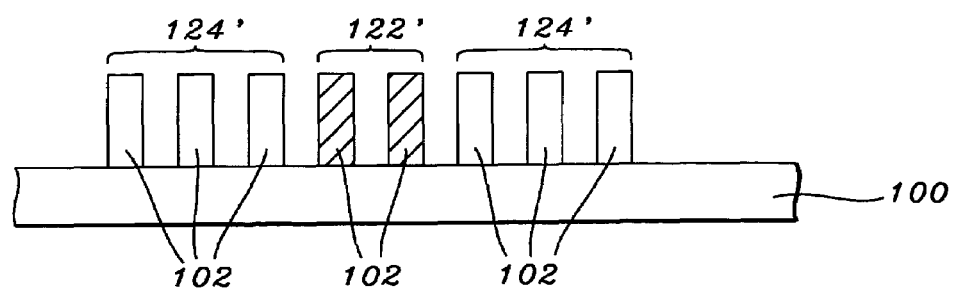

The layer 102 is etched, as shown in the cross section of FIG. 17b, using the pattern 122/124 of FIG. 17a as a mask, resulting in the patterns 122' and 124' in the layer 102 of semiconductor material. The developed layer 120 of photoresist has, in the cross section of FIG. 17b, been removed after the etch of layer 102 has been completed.

Figure 17C:
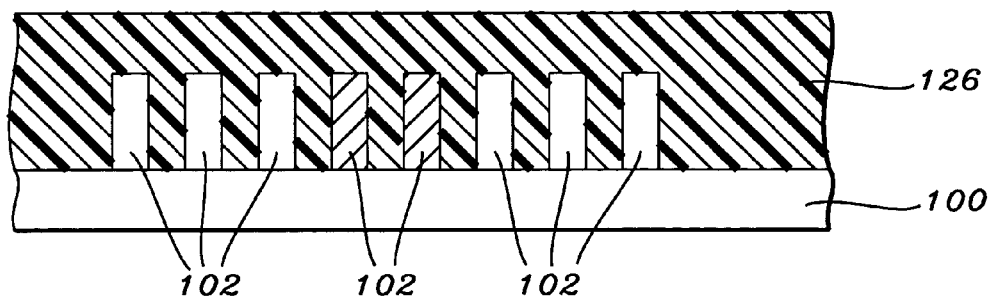

A second layer 126 of photo sensitive material is next applied over the patterned layer 102, as shown in the cross section of FIG. 17c. The second layer 126 of photo resist is patterned and developed, creating openings 123 and 125 therethrough, shown in the cross section of FIG. 17d, that expose the dummy features 124' previously created in layer 102. These dummy features 124' are now removed, as shown in the cross section of FIG. 17e.

Figure 17D:
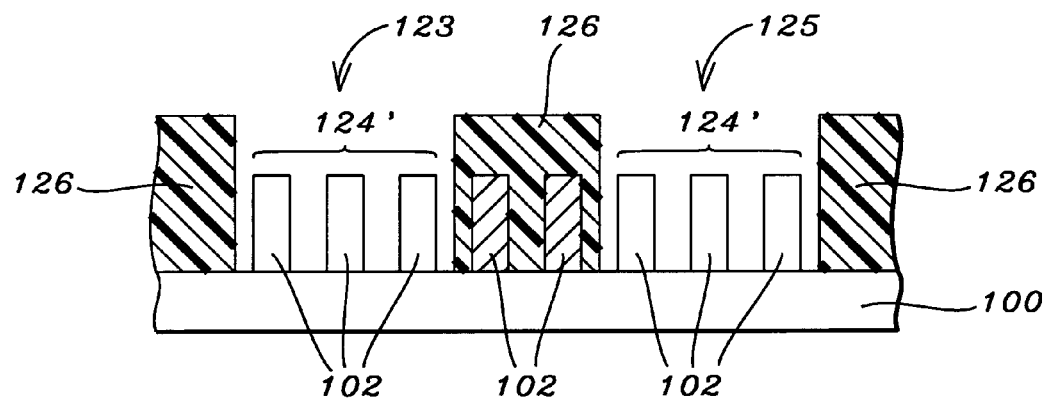
Figure 17E:
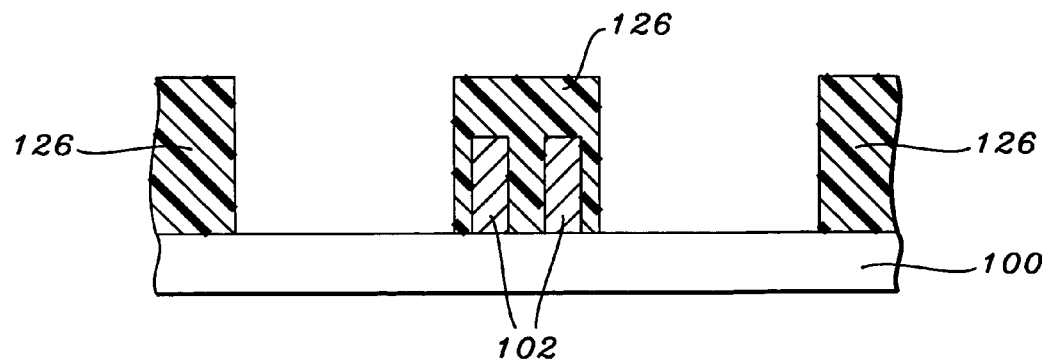
Figure 17F:
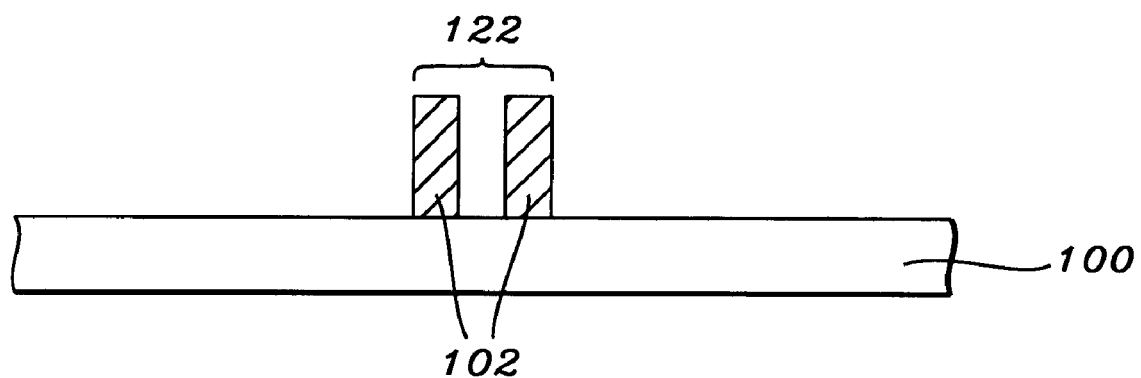

After the developed layer 126 of photo resist is removed, the main features 122 remain in place as shown in the cross section of FIG. 17f. These main features may, since layer 102 may be a layer of hardmask material, also comprise a patterned hard mask.

Figure 18:
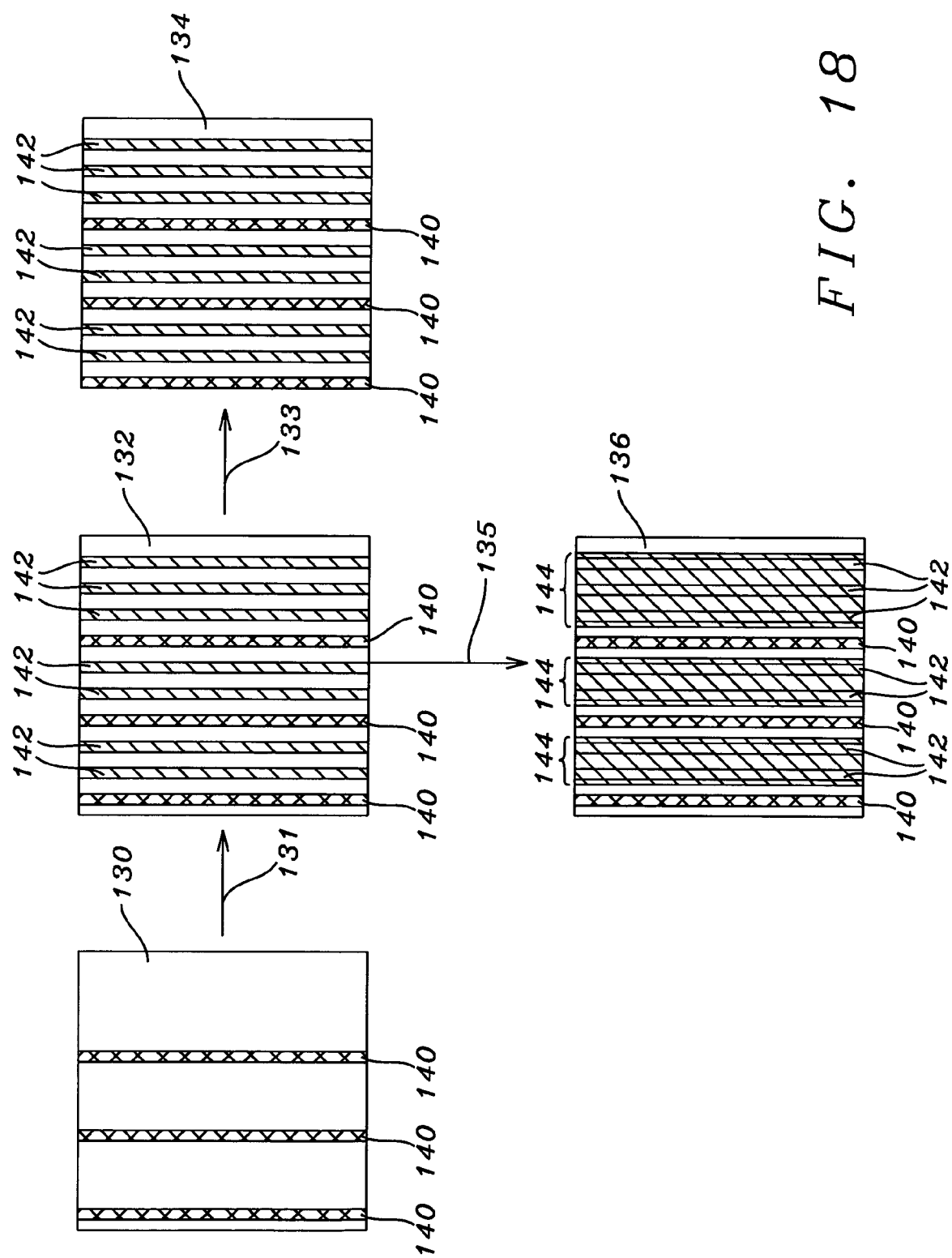

FIG. 18 shows the steps of pattern generation that are provided by the invention, as follows:

- the general design parameters are first created for the main pattern and the isolated pattern, such as patterns 110 and 112 shown in cross section in FIGS. 16a/16b; these patterns are collectively highlighted in FIG. 18 as pattern 140, step 130; this represents a first step that is needed for the creation of the cross section shown in FIGS. 16a/16b
- the general design parameters 140 are, via link 131 advanced to function 132, where dummy features are added to the general design parameters 140, such as dummy features 114/116 shown in the cross sections of FIGS. 16a/16b; this represents a second step that is needed for the creation of the cross section shown in FIGS. 16a/16b
- the combined general design parameters for pattern 140 and for the dummy features 142 are outputted to function 134 for application of photolithographic exposure followed by etch via link 133, and
- via link 135 a trim mask 144 is created by function 136 to remove dummy features after the etch, such as the removal of dummy features 114'/116' shown in the cross sections of FIGS. 16c/16d.

The steps shown in the flowchart of FIG. 18 are in accordance with the previously highlighted aspects of the invention.

Figure 20:
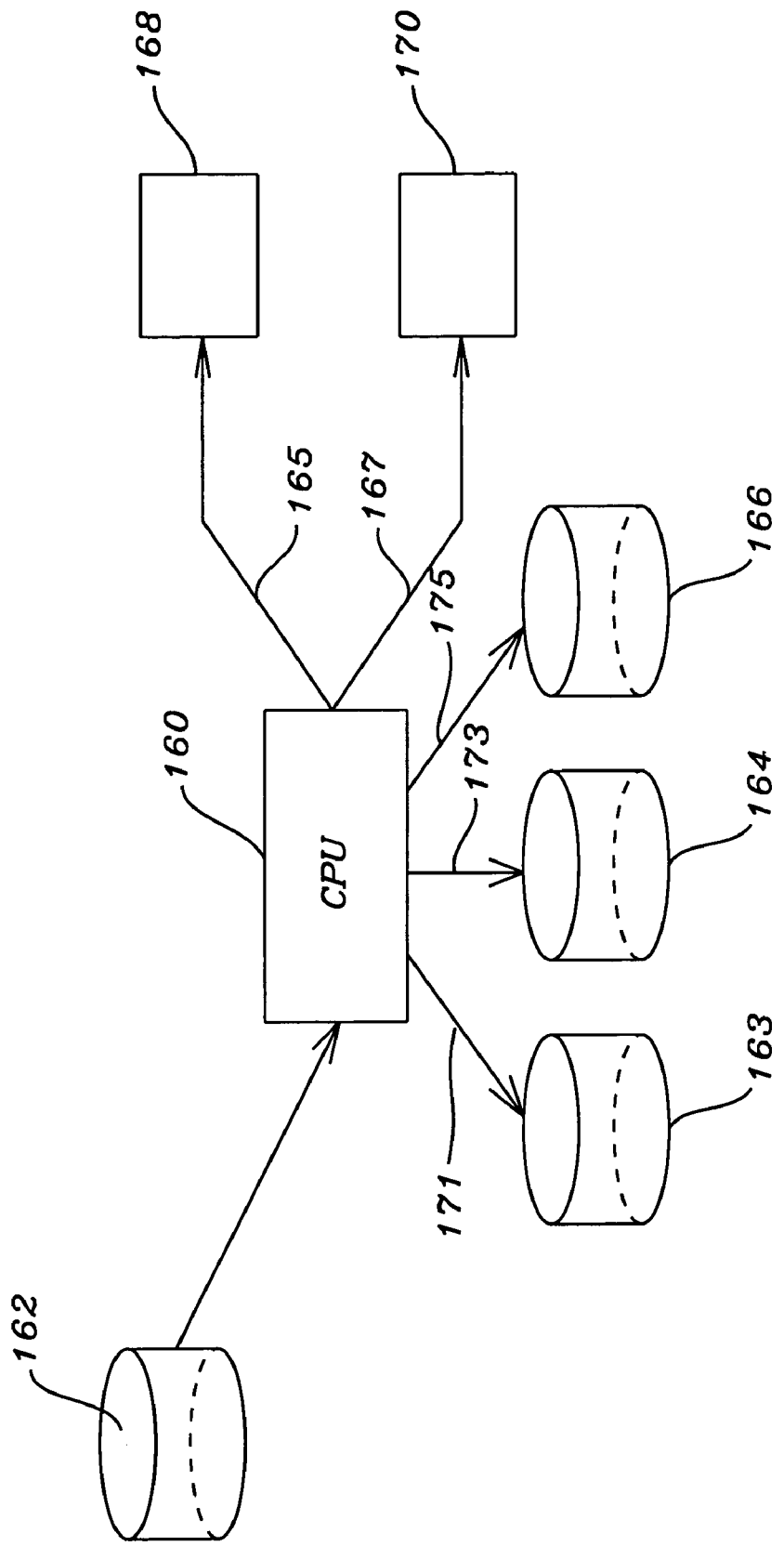

The steps that are highlighted in the flowchart of FIG. 18 can be system implemented as shown in the system flowchart of FIG. 20.

Specifically highlighted in FIG. 20 are the following system functions and components:

- 160 is the central processing unit (CPU) which provides the (software) functions in support of the invention
- 162 is the data base on which the original device design resides, that is the design that previously has been highlighted as comprising main patterns and isolated patterns, this record corresponds with the device layout shown in block 130 of FIG. 18
- a software support function, residing in CPU 160, adds dummy features to the main patterns and to the isolated patterns of a semiconductor device layout; the resulting semiconductor device exposure pattern is stored on data base 163 via link 171, the created record corresponds with the device layout shown in block 132 of FIG. 18
- a software support function, also residing on CPU 160 creates, using, via link 171, as input the (main pattern/isolated pattern/dummy features pattern) records stored on data base 163, creates exposure patterns there-of in which the previously highlighted Compensation for Optical Proximity (COPE) is applied to the exposure pattern of the main patterns and the isolated patterns and the dummy feature pattern, these COPE patterns for the device layout are stored as (COPE implemented) device exposure patterns on date base 164 via link 173; these records represent block 134 in FIG. 18 and result in an exposure mask 122/124 as is shown in for instance FIG. 17a
- yet one more software support function, residing and supported by CPU 160, using as input, via link 171, the (main pattern/isolated pattern/dummy features pattern) records stored on data base 163, creates exposure patterns there-of that expose the dummy features of the device layout, these exposure patterns are stored on data base 166 via link 175; these records represent block 136 in FIG. 18 and result in an exposure as is for instance shown in FIG. 17d
- the COPE record of the main pattern/isolated pattern/dummy features pattern is sent, via interconnect 165, from data base 164, under control of CPU 160, to photolithographic exposure tool 168, for the creation of a blocking mask as for instance shown in the cross section of FIG. 17a, the patterned layer 102 comprising elements 122/124
- the dummy feature exposure pattern is sent, via interconnect 167, from data base 166 to photolithographic exposure tool 170, for the removal of the dummy features, as is for instance shown in the cross section of FIG. 17e; it is recognized that tools 168 and 170 may well be one and the same processing chamber.

Not shown in the flow diagram of FIG. 20 are means for date entry and data extraction, the former for instance comprising computer terminals and graphic display devices, the latter for instance comprising printers and graphic display devices. It is thereby further assumed that functions of data entry and data extraction or data display can be invoked and exercised by the photolithographic exposure tools 168 and 170, so that these tools can be applied in real-time mode and so that conditions of photolithographic exposure by tools 168 and 170 can be reflected in and integrated with the software support functions that have been highlighted above as these functions are provided by CPU 160.

A practical application of the invention is shown in FIGS. 19a through 19f. The particle application shown relates to the creation of a patterned layer of polysilicon such as for instance can be applied for the creation of semiconductor devices in the 248 nm technology, more particularly as can be applied for the creation of floating gates that from part of DRAM cells.

It must be noted in the cross sections of FIGS. 19a through 19f that, as opposed to previously highlighted cross sections, the layer of semiconductor material, such as layer 102 shown in FIGS. 16a through 16f, comprises for the cross sections shown in FIGS. 19a through 19f two layers, that is a layer 152 of hardmask material and a layer 150 of polysilicon.

Figure 19A:
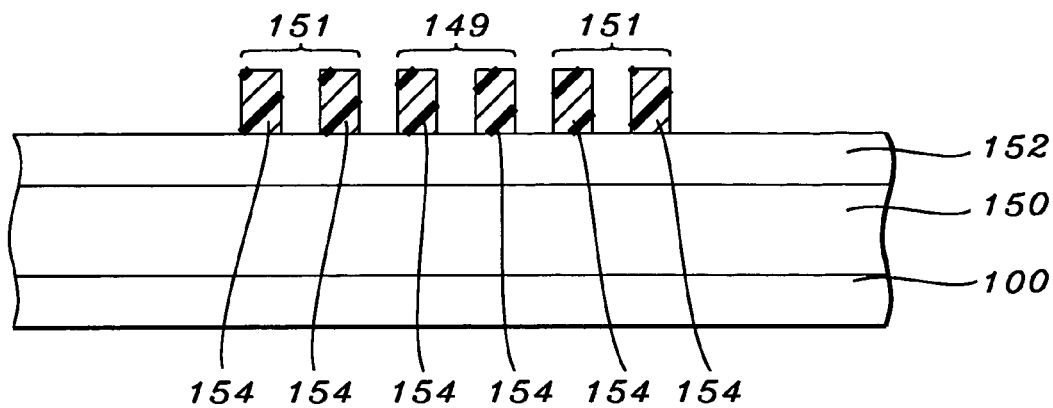
FIGS. 19a through 19f show the creation of two patterned layers of polysilicon, using correction of optimal proximity effect and applying two layers of photo sensitive material.

The cross section of FIG. 19a shows the cross section of a semiconductor surface 100, such as the surface of a silicon substrate, over which a layer 150 of polysilicon has been deposited. A layer 152 of hardmask material is deposited over the layer 150 of polysilicon.

A first layer 154 of photoresist has been patterned, creating therein a main pattern 149 and a dummy pattern 151.

Figure 19B:
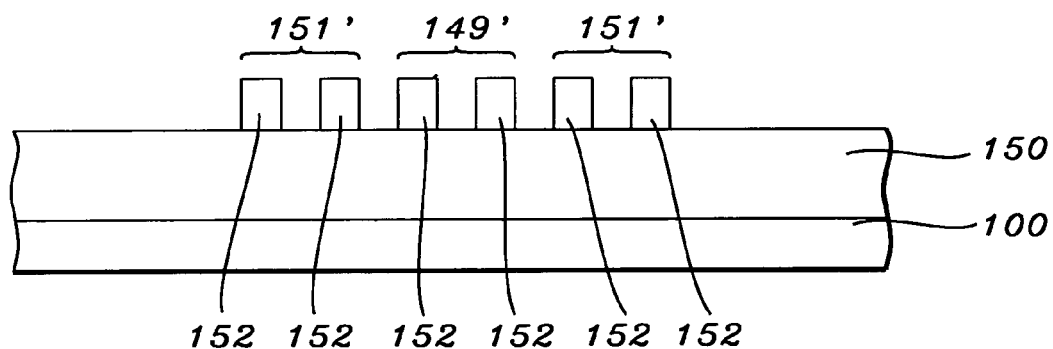

The developed first layer 154 of photoresist serves as a mask for the etch of the layer 152 of hard mask material, as shown in the cross section of FIG. 19b, transposing the pattern of layer 154 of photoresist to layer 152 of hardmask material, after which the developed layer 154 of photoresist is removed.

Figure 19C:
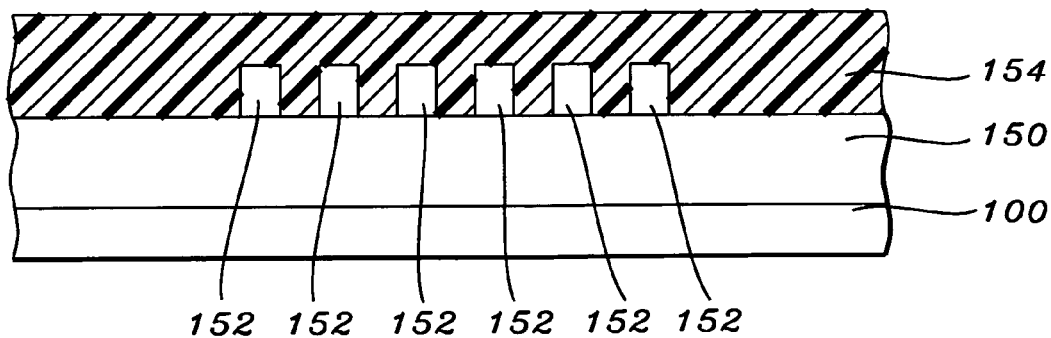
Figure 19D:
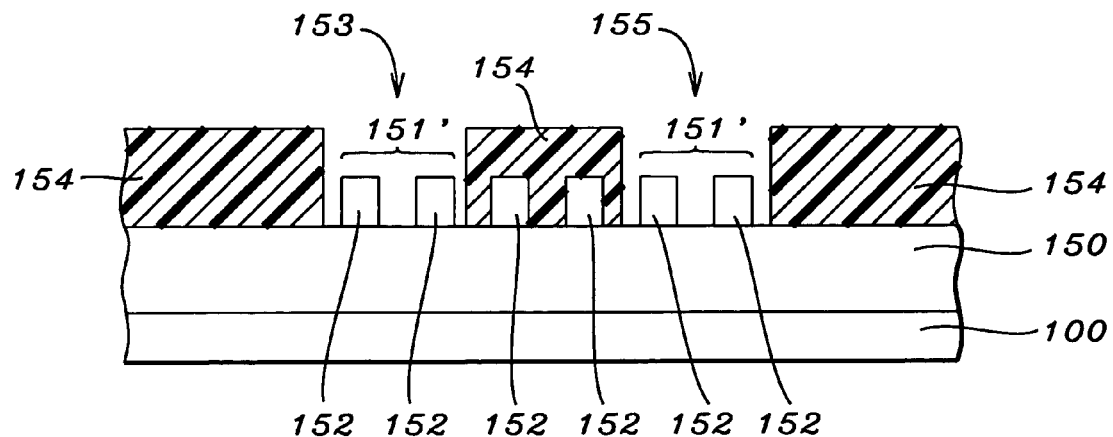
Figure 19E:
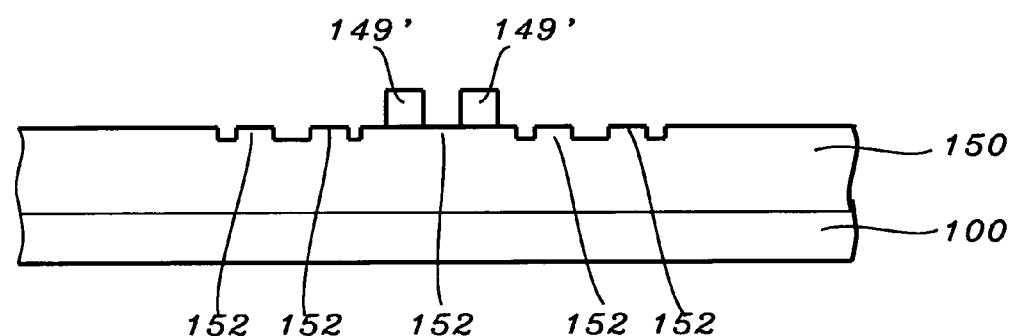
Figure 19F:
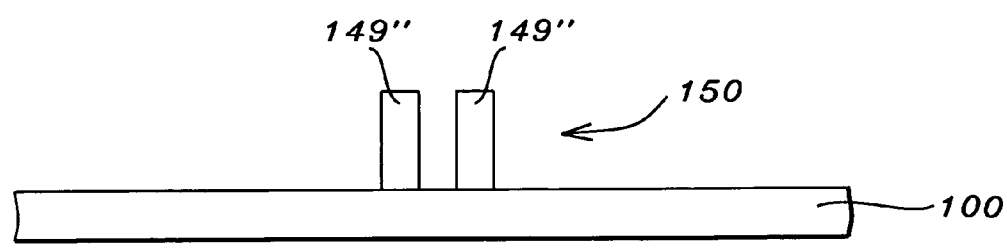

A second layer 154 of photoresist is deposited over the structure that is shown in cross section in FIG. 19b, as shown in the cross section of FIG. 19c. The second layer 154 of photoresist is patterned, creating openings 153 and 155 through layer 154 as shown in the cross section of FIG. 19d. Openings 153 and 155 expose the dummy pattern 151', which can now be etched resulting in the cross section shown in FIG. 19e after the developed second layer 154 of photoresist has been removed. The pattern 149' of hardmask material remains in place and can now be used for the etching of the layer 150 of polysilicon, resulting in the pattern 149" of polysilicon that is shown in the cross section of FIG. 19f. Based on the premise, which has been used throughout the explanation of the invention, that correction for effects of optical proximity has been applied to the various patterns that are used for the creation of pattern 149", it can be stated that this pattern 149" now has the same CD.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for reducing Critical Dimension (CD) non-uniformity in creating a patterned layer of semiconductor material, comprising:

providing a substrate, said substrate having been provided with one or more layers of semiconductor material;

depositing a first masking layer over one or more layers of semiconductor material;

creating, while applying methods for compensation of optical proximity effects and micro-loading, a first pattern in said first masking layer, said first pattern being a pattern of high-density semiconductor device features and isolated semiconductor device features and dummy features, said creating while applying methods for compensation of optical proximity effects and micro-loading a first pattern in said first masking layer comprising:

first exposing said first masking layer with a first mask, said first mask comprising a first and a second pattern, said first pattern being a pattern of high-density semiconductor device features having a first cross-section, said second pattern being full-size assist features having a second cross-section, said full-size assist features being designed to maximize contribution to spatial frequency and to achieve unification of an exposure level of the high-density device features;

second exposing said first masking layer with a second mask, said second mask comprising a third pattern, said third pattern aligning with said second pattern on said first mask; and etching said first masking layer in accordance with said first and second exposure of said masking layers;

patterning at least one of said one or more layers of semiconductor material in accordance with said first pattern; removing said first masking layer;

depositing a second masking layer over said at least one layer of semiconductor material, including said patterned at least one of said one or more layers of semiconductor material;

creating a second pattern in said second masking layer, said second pattern exposing dummy features of said patterned at least one of said one or more layers of semiconductor material;

patterning said at least one layer of semiconductor material in accordance with said second pattern; and removing said second masking layer.

2. The method of claim 1, said third pattern having dimensions being larger than dimensions of said second pattern by a measurable amount.

3. The method of claim 1, a distance between elements of said full-size assist feature and elements of said high-density semiconductor device features being within a range of between about 0.5 and 3.0 times said cross-section of said high-density semiconductor device features.

4. The method of claim 1, said first cross-section being about equal to said second cross-section.

5. The method of claim 1, a distance between elements of said full-size assist feature and elements of said high-density semiconductor device features and said isolated features and said dummy features being determined by first independent parameters, said first independent parameters being dimensions of said high-density semiconductor device features, said first independent parameters having as objective maximization of said contribution to spatial frequency and to achieving unification of an exposure level of the high-density device features by said full-size assist features, thereby assuring optimum imaging performance.

6. The method of claim 1, a design of said full-size assist feature being determined by second independent parameters, said second independent parameters being dimensions of said high-density semiconductor device features, said second independent parameters having as objective maximization of said contribution to spatial frequency and to achieving unification of an exposure level of the high-density device features by said full-size assist features, thereby assuring optimum imaging performance.

7. The method of claim 1, said first masking layer comprising photoresist.

8. The method of claim 1, said first and said second pattern comprising an opaque surface region of said first mask surrounded by a transparent background surface region.

9. The method of claim 1, said first and said second pattern comprising a transparent surface region of said first mask surrounded by an opaque background surface region.

10. The method of claim 1, said third pattern comprising an opaque surface region of said first pattern surrounded by a transparent background surface region.

11. The method of claim 1, said third pattern comprising a transparent surface region of said first pattern surrounded by an opaque background surface region.

12. The method of claim 1, said first masking layer comprising an insulating material.

13. The method of claim 1 wherein overlapping full-size assist features of said second pattern of full-size assist features are combined into larger full-size assist features.

14. The method of claim 1 wherein said second pattern comprises side-by-side full-size assist features.

15. The method of claim 1, said third pattern being aligned with said first pattern, keying said third pattern to said first pattern.

16. The method of claim 1, elements of said second pattern being interspersed with elements of said first pattern.

17. The method of claim 1, elements of said second pattern surrounding elements of said first pattern.

18. The method of claim 1, said second masking layer comprising photoresist.

19. The method of claim 1, said at least one layer of semiconductor material being a layer of dielectric, a layer of insulating material, a layer of passivation material, a layer of hardmask material or a layer of conductive material.

20. The method of claim 1, said high-density semiconductor device features being separated by a distance of 2.0 μm or less.

21. The method of claim 1, said isolated semiconductor device features being separated from adjacent pattern features by a distance of 2.0 μm or less.

22. The method of claim 1, said dummy features being separated from adjacent high-density semiconductor device features or isolated semiconductor device by a distance of 2.0 μm or less.

* * * * *